United States Patent
Sakai et al.

(10) Patent No.: US 9,029,048 B2
(45) Date of Patent: *May 12, 2015

(54) MASK BLANK, TRANSFER MASK, METHOD OF MANUFACTURING TRANSFER MASK AND METHOD OF MANUFACTURING SEMICONDUCTOR DEVICE

(71) Applicant: Hoya Corporation, Shinjuku-ku, Tokyo (JP)

(72) Inventors: Kazuya Sakai, Shinjuku-ku (JP); Ryo Ohkubo, Shinjuku-ku (JP); Osamu Nozawa, Shinjuku-ku (JP); Toshiyuki Suzuki, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 238 days.

This patent is subject to a terminal disclaimer.

(21) Appl. No.: 13/628,552

(22) Filed: Sep. 27, 2012

(65) Prior Publication Data
US 2013/0078553 A1 Mar. 28, 2013

(30) Foreign Application Priority Data
Sep. 28, 2011 (JP) .................. 2011-212583

(51) Int. Cl.
G03F 1/50 (2012.01)
G03F 1/58 (2012.01)

(52) U.S. Cl.
CPC ...... *G03F 1/58* (2013.01); *G03F 1/50* (2013.01)

(58) Field of Classification Search
CPC .............. G03F 1/50; G03F 1/54; G03F 1/58
USPC .................... 430/5, 311, 313, 322, 323
See application file for complete search history.

(56) References Cited

U.S. PATENT DOCUMENTS

| 8,524,421 B2 * | 9/2013 | Nozawa et al. .......... 430/5 |
| 2009/0226826 A1 | 9/2009 | Nozawa |
| 2009/0246647 A1 * | 10/2009 | Hashimoto et al. ......... 430/5 |
| 2010/0143831 A1 | 6/2010 | Yoshikawa et al. |

FOREIGN PATENT DOCUMENTS

| JP | 2006-78807 A | 3/2006 |
| JP | 2009-230112 A | 10/2009 |
| JP | 2010-192503 A | 9/2010 |

* cited by examiner

*Primary Examiner* — Stephen Rosasco
(74) *Attorney, Agent, or Firm* — Sughrue Mion, PLLC

(57) ABSTRACT

The present invention is a mask blank used to fabricate a transfer mask, which has a laminated structure of a light shielding film and an etching mask film in this order on a transparent substrate, wherein the etching mask film comprises a material containing chromium, the light shielding film comprises a material containing tantalum, a highly oxidized layer is formed on the surface layer of the light shielding film on the opposite side from the transparent substrate, and a Ta 4 f narrow spectrum of the highly oxidized layer analyzed by X-ray photoelectron spectroscopy has a maximum peak at a binding energy of more than 23 eV.

18 Claims, 8 Drawing Sheets

MASK BLANK, TRANSFER MASK, METHOD OF MANUFACTURING TRANSFER MASK AND METHOD OF MANUFACTURING SEMICONDUCTOR DEVICE

TECHNICAL FIELD

The present invention relates to a mask blank, a transfer mask fabricated using the mask blank and a manufacturing method thereof, and a semiconductor device using the transfer mask.

BACKGROUND ART

In general, in the manufacturing processes of a semiconductor device, a fine pattern is formed using photolithography. In addition, several substrates referred to as transfer masks are normally used to form this fine pattern. The transfer masks are typically provided with a fine pattern composed of a metal thin film and the like on a transparent glass substrate. In addition, photolithography is also used to produce this transfer mask.

In order to miniaturize semiconductor device patterns, in addition to miniaturizing the mask pattern formed on the transfer mask, it is also necessary to shorten the wavelength of the exposure light source wavelength used in lithography. The wavelength of exposure light sources used during production of semiconductor devices has recently become shorter with the transition from KrF excimer lasers (wavelength: 248 nm) to ArF excimer lasers (wavelength: 193 nm).

Binary masks having a pattern of a light shielding film composed of a chromium-based material on a transparent substrate have been known as transfer masks for long time. In recent years, binary masks have also appeared for use with ArF excimer lasers that use a material comprising a molybdenum silicide compound (MoSi-based material) (Patent Literature 1: JP-A-2006-78807). In addition, binary masks have also appeared for use with ArF excimer lasers that use a material comprising a tantalum compound (tantalum-based material) for the light shielding film (Patent Literature 2: JP-A-2009-230112). Patent Literature 3 (JP-A-2010-192503) discloses that a light shielding film may undergo hydrogen embrittlement in the case of carrying out acid washing or washing with hydrogen plasma on a photomask composed of a light shielding film using tantalum, niobium, vanadium or at least two metals comprising tantalum, niobium and vanadium. In addition, the formation of a hydrogen blocking film that provides an airtight coating over the upper surface and lateral surfaces of the light shielding film following formation of a pattern on the light shielding film has been disclosed as means for solving this problem.

BRIEF SUMMARY OF THE INVENTION

The level of precision at which patterns are positioned on transfer masks has become increasingly severe in recent years. In the past, in the case of fabricating a transfer mask using a mask blank provided with a light shielding film on a transparent substrate, a transfer pattern was formed on a light shielding film by dry etching using a resist pattern of an organic material formed on the light shielding film as a mask. However, with the increased level of miniaturization of transfer patterns, the line width of the main pattern formed on the light shielding film has become finer at about 128 nm in hp 32 nm generation DRAM. Moreover, in the case of hp 32 nm generation DRAM, the line width of auxiliary patterns such as sub resolution assist features (SRAF) has become extremely fine at about 50 nm. Thus, it is becoming difficult to directly form transfer patterns by carrying out dry etching on light shielding films using a resist film of an organic material in which a transfer pattern having a fine line width in this manner is formed. As means for solving this problem, an etching mask film (hard mask) of a metal material as described in Patent Literature 1 (JP-A-2006-78807) has is been being applied.

For example, in the case of a transfer mask having a light shielding film of a molybdenum silicide-based material, the transfer mask is fabricated using a mask blank in which a light shielding film composed of a molybdenum silicide-based material, an etching mask film composed of a chromium-based material, and a resist film composed of an organic material are laminated on a transparent substrate. The production process of this transfer mask comprises, first, forming a resist pattern by carrying out prescribed treatment such as lithography, exposure and development using a transfer pattern on the resist film in the same manner as in the past. Next, dry etching is carried out on an etching mask film using a mixed gas of a chlorine-based gas and oxygen gas by using the resist pattern as a mask to form a transfer pattern on the etching mask film. Continuing, dry etching is carried on a light shielding film using a fluorine-based gas by using the etching mask film in which the transfer pattern has been formed as a mask to form a transfer pattern on the light shielding film. Finally, the etching mask film is removed and conventional prescribed treatment such as washing is carried out to obtain a transfer mask.

The reason why this type of production process is able to be carried out is that dry etching properties differ between the etching mask film of the chromium-based material and the light shielding film of the molybdenum silicide-based material. Although etching mask films of chromium-based materials can be dry-etched with a mixed gas of a chlorine-based gas and oxygen gas, they are highly resistant to dry etching with a fluorine-based gas. In contrast, although light shielding films of molybdenum silicide-based materials can be dry-etched with a fluorine-based gas, they are highly resistant to dry etching with a mixed gas of a chlorine-based gas and oxygen gas. In this manner, etching mask films of chromium-based materials and light shielding films of molybdenum silicide-based materials mutually have high etching selectivity. Furthermore, being able to dry-etch a thin film as referred to here refers to having an etching rate sufficient for allowing the formation of a transfer pattern on a thin film when dry etching is carried out on that thin film by using a mask film having a transfer pattern as a mask.

On the other hand, in the case of producing a transfer mask of a light shielding film using a tantalum-based material, tantalum-based materials have been determined to have unique problems in the case of conducting studies on the use of a mask blank obtained by laminating a light shielding film composed of a tantalum-based material, an etching mask film composed of a chromium-based material and a resist film composed of an organic material on a transparent substrate in the same manner as previously described. In the case of dry etching a tantalum-based material that demonstrates little bonding with oxygen (oxygen content in the material is low), a fluorine-based gas or a chlorine-based gas without containing oxygen can be used for the etching gas. In contrast, in the case of a tantalum-based material that demonstrates extensive bonding with oxygen (oxygen content in the material is high), dry etching can be carried out using a fluorine-based gas for the etching gas. However, in the case of carrying out dry etching on a tantalum-based material that demonstrates extensive bonding with oxygen (oxygen content in the material is high) using a chlorine-based gas that does not contain oxygen, an etching rate sufficient for forming a transfer pattern is unable to be obtained.

Since etching gas enabling dry etching of a tantalum-based material and etching gas enabling dry etching of a chromium-based material are not completely identical, it appears at first glance that it is sufficiently possible to fabricate a transfer mask using a mask blank of a laminated structure comprising a light shielding film of a tantalum-based material and an etching mask film of a chromium-based material. It is possible to a certain extent to form a transfer pattern by dry etching a light shielding film of a tantalum-based material using an etching mask film of a chromium-based material in which a transfer pattern has been formed as a mask. However, when the etching mask film is removed after having formed the transfer pattern on the light shielding film, it was determined that there is a detrimental effect on the surface of the light shielding film, or the edges of the pattern of the light shielding film become rounded. This problem occurs in the case the etching mask film is stripped by dry etching using a mixed gas of a chlorine-based gas and oxygen gas.

Tantalum-based materials have the property of being dry-etched by a chlorine-based gas. Consequently, this problem occurs since the resistance of the tantalum-based material to dry etching with a mixed gas of a chlorine-based gas and oxygen gas is lower than the case of a molybdenum silicide-based material even in cases in which the oxygen content in a tantalum-based material is comparatively high. If the surface of a light shielding film ends up being subjected to the effects of dry etching using a mixed gas of a chlorine-based gas and oxygen gas, surface reflectance relative to exposure light ends up increasing beyond the design value or uniformity of the distribution of in-plane surface reflectance ends up decreasing, thereby impairing optical properties when used as a transfer mask. In addition, if rounding of the pattern edges of the light shielding film ends up occurring, this leads to poor line edge roughness of the pattern resulting in a decrease in transfer performance.

Therefore, in consideration of the aforementioned problems, an object of the present invention is to provide a mask blank that allows the fabrication of a transfer mask having a highly precise transfer pattern and a light shielding film having favorable optical properties by using a mask blank obtained by laminating a light shielding film of tantalum-based material and an etching mask film of a chromium-based material. In addition, an object of the present invention is to provide a transfer mask having a highly precise transfer pattern and a light shielding film having favorable optical properties, and a manufacturing method thereof. Moreover, an object of the present invention is to provide a manufacturing method of a semiconductor device with no wiring short circuits and no disconnections in circuit patterns attributable to inadequate overlay accuracy.

The present invention has the following configurations in order to achieve the aforementioned objects.

(Configuration 1)
Configuration 1 of the present invention is a mask blank used to fabricate a transfer mask that has a laminated structure of a light shielding film and an etching mask film in this order on a transparent substrate, wherein
the etching mask film comprises a material containing chromium,
the light shielding film comprises a material containing tantalum, and
a highly oxidized layer having an oxygen content of not less than 60 atomic percent (at %) is formed on the surface layer of the light shielding film on the opposite side from the transparent substrate. Use of the mask blank of the present invention makes it possible to fabricate a transfer mask having a highly precise transfer pattern and a light shielding film having favorable optical properties.

(Configuration 2)
Configuration 2 of the present invention is the mask blank described in Configuration 1, wherein the oxygen content of the highly oxidized layer is not less than 67 at %. If the oxygen content of the highly oxidized layer is not less than 67 at %, not only does $TaO_2$ bonding become predominant, but the ratio of the $Ta_2O_5$ bonding state is also thought to increase. Thus, $Ta_2O_3$ and $TaO_2$ bonding states are only rarely present, and the unstable $Ta_2O_5$ bonding state is no longer able to be present.

(Configuration 3)
Configuration 3 of the present invention is the mask blank described in Configuration 1 or Configuration 2, wherein the ratio of the presence of $Ta_2O_5$ bonding in the highly oxidized layer is higher than the ratio of the presence of $Ta_2O_5$ bonding in the light shielding film. $Ta_2O_5$ bonding is a bonding state having extremely high stability, and as a result of increasing the ratio of the presence of $Ta_2O_5$ bonding in the highly oxidized layer, resistance to dry etching with a mixed gas of a chlorine-based gas and oxygen gas increases considerably.

(Configuration 4)
Configuration 4 of the present invention is the mask blank described in any of Configurations 1 to 3, wherein the light shielding film comprises of a material that further contains nitrogen. Oxidation of tantalum can be inhibited by containing nitrogen in a light shielding film comprising tantalum.

(Configuration 5)
Configuration 5 of the present invention is the mask blank described in any of Configurations 1 to 3, wherein the light shielding film has a laminated structure of a lower layer and an upper layer in this order starting from the side of the transparent substrate, and
the highly oxidized layer is formed on the surface layer of the upper layer on the opposite side from the lower layer. As a result of adopting this configuration, the upper layer can be made to function as a film having a function that controls surface reflectance of the light shielding film with respect to exposure light (antireflective film).

(Configuration 6)
Configuration 6 of the present invention is the mask blank described in Configuration 5, wherein the oxygen content of the upper layer is less than the oxygen content of the highly oxidized layer. As a result, the total thickness of the light shielding film can be further reduced while increasing the optical density obtained by the upper layer, and surface reflectance of the light shielding film can be reduced.

(Configuration 7)
Configuration 7 of the present invention is the mask blank described in Configuration 6, wherein the oxygen content of the upper layer is not less than 50 at %. In the case the upper layer with a material that contains tantalum is made to contain oxygen at not less than 50 at %, all of the tantalum in the upper layer is theoretically bound to oxygen. An upper layer having a small amount of tantalum that does not bound to oxygen in this manner has resistance to dry etching with a chlorine-based etching gas without containing oxygen.

(Configuration 8)
Configuration 8 of the present invention is the mask blank described in any of Configurations 5 to 7, wherein the ratio of the presence of $Ta_2O_5$ bonding in the highly oxidized layer is higher than the ratio of the presence of $Ta_2O_5$ bonding in the upper layer. $Ta_2O_5$ bonding is a bonding state having extremely high stability, and as a result of increasing the ratio of the presence of Ta$_2$O$_5$ bonding in the highly oxidized layer, resistance to dry etching with a mixed gas of a chlorine-based gas and oxygen gas increases considerably.

(Configuration 9)

Configuration 9 of the present invention is the mask blank described in any of Configurations 5 to 8, wherein the oxygen content of the lower layer is less than 10 at %. As a result of considerably suppressing the oxygen content of the lower layer composed of a material containing tantalum, the dry etching rate with a chlorine-based gas without containing oxygen can be increased.

(Configuration 10)

Configuration 10 of the present invention is the mask blank described in any of Configurations 5 to 9, wherein the lower layer comprises a material that contains nitrogen. Oxidation of tantalum can be inhibited by containing nitrogen in a lower layer comprising tantalum.

(Configuration 11)

Configuration 11 of the present invention is the mask blank described in any of Configurations 5 to 10, wherein the oxygen content of the etching mask film is not less than 40 at %. If the oxygen content in the etching mask film is not less than 40 at %, the etching rate with respect to a chlorine-based gas without containing oxygen becomes equal to or greater than a specified value. As a result, the etching mask film is easily removed simultaneous to dry etching of the lower layer.

(Configuration 12)

Configuration 12 of the present invention is the mask blank described in Configuration 11, wherein the thickness of the etching mask film is not more than 7 nm. If the thickness of the etching mask film is not more than 7 nm, the etching mask film is easily removed simultaneous to dry etching of the lower layer.

(Configuration 13)

Configuration 13 of the present invention is a transfer mask fabricated using the mask blank described in any of Configurations 1 to 12. Use of the mask blank of the present invention makes it possible to obtain a transfer mask having a highly precise transfer pattern and a light shielding film having favorable optical properties.

(Configuration 14)

Configuration 14 of the present invention is a method of manufacturing a transfer mask that uses the mask blank described in any of Configurations 1 to 4, comprising the steps of:

forming a resist film having a transfer pattern on the etching mask film;

forming a transfer pattern in the etching mask film by using the resist film in which the transfer pattern has been formed as a mask and dry etching using a mixed gas of a chlorine-based gas and oxygen gas;

forming a transfer pattern in the light shielding film by dry etching using the resist film or etching mask film in which the transfer pattern has been formed as a mask; and removing the etching mask film by dry etching using a mixed gas of a chlorine-based gas and oxygen gas after forming the transfer pattern in the light shielding film. According to the method of the present invention, a transfer mask that has a highly precise transfer pattern and a light shielding film having favorable optical properties, can be fabricated.

(Configuration 15)

Configuration 15 of the present invention is a method of manufacturing a transfer mask that uses the mask blank described in any of Configurations 5 to 11, comprising the steps of:

forming a resist film having a transfer pattern on the etching mask film;

forming a transfer pattern in the etching mask film by using the resist film in which the transfer pattern has been formed as a mask and dry etching using a mixed gas of a chlorine-based gas and oxygen gas;

forming a transfer pattern in the upper layer by using the resist film or etching mask film in which the transfer pattern has been formed as a mask, and dry etching using a fluorine-based gas;

forming a transfer pattern in the lower layer by using the resist film, etching mask film or upper layer in which the transfer pattern has been formed as a mask, and dry etching using chlorine-based gas substantially without containing oxygen; and removing the etching mask film by dry etching using a mixed gas of a chlorine-based gas and oxygen gas after forming the transfer pattern in the lower layer. According to the method of the present invention, a transfer mask that has a highly precise transfer pattern and a light shielding film having favorable optical properties, can be fabricated.

(Configuration 16)

Configuration 16 of the present invention is a method of manufacturing a transfer mask that uses the mask blank described in Configuration 12, comprising the steps of:

forming a resist film having a transfer pattern on the etching mask film;

forming a transfer pattern in the etching mask film by using the resist film having the transfer pattern as a mask and dry etching using a mixed gas of a chlorine-based gas and oxygen gas;

removing the resist film;

forming a transfer pattern in the upper layer by using the etching mask film in which the transfer pattern has been formed as a mask, and dry etching using a fluorine-based gas; and forming a transfer pattern in the lower layer by using the upper layer in which the transfer pattern has been formed as a mask and dry etching using chlorine-based gas substantially without containing oxygen, and removing the etching mask film. According to the method of the present invention, a transfer mask that has a highly precise transfer pattern and a light shielding film having favorable optical properties, can be fabricated.

(Configuration 17)

Configuration 17 of the present invention is a method of manufacturing a semiconductor device, comprising exposing and transferring a transfer pattern to a resist film on a semiconductor substrate using the transfer mask described in Configuration 13. According to the present invention, a semiconductor device can be obtained, which is without wiring short circuits and disconnections in circuit patterns attributable to inadequate overlay accuracy.

(Configuration 18)

Configuration 18 of the present invention is a method of manufacturing a semiconductor device, comprising exposing and transferring a transfer pattern to a resist film on a semiconductor substrate using a transfer mask fabricated according to the method of manufacturing the transfer mask described in any of Configurations 14 to 16. According to the present invention, a semiconductor device can be obtained, which is without wiring short circuits and disconnections in circuit patterns attributable to inadequate overlay accuracy.

In addition, the present invention also has the following configurations in order to achieve the aforementioned objects.

(Configuration 1A)

Configuration 1A of the present invention is a mask blank used to fabricate a transfer mask that has a laminated structure of a light shielding film and an etching mask film in this order on a transparent substrate, wherein the etching mask film comprises a material containing chromium, the light shielding film comprises a material containing tantalum, a highly oxidized layer is formed on the surface layer of the light shielding film on the opposite side from the transparent substrate, and a Ta 4 f narrow spectrum of the highly oxidized layer analyzed by X-ray photoelectron spectroscopy has a maximum peak at a binding energy of more than 23 eV. Use of the mask blank of the present invention makes it possible to fabricate a transfer mask having a highly precise transfer pattern and a light shielding film having favorable optical properties.

(Configuration 2A)

Configuration 2A of the present invention is the mask blank described in Configuration 1A, wherein the Ta 4 f narrow spectrum of the portion of the light shielding film other than the highly oxidized layer has a maximum peak at a binding energy of not more than 23 eV, when the light shielding film is analyzed by X-ray photoelectron spectroscopy. By controlling the Ta 4 f narrow spectrum of the portion of the light shielding film other than the highly oxidized layer in this manner, the ratio of the presence of $Ta_2O_5$ in the portion of the light shielding film other than the highly oxidized layer can be reduced and light shielding performance can be enhanced.

(Configuration 3A)

Configuration 3A of the present invention is the mask blank described in Configuration 1A or Configuration 2A, wherein the light shielding film comprises a material that does not contain silicon. As a result of not containing silicon, which has properties that is easily bond with oxygen and nitrogen, in the light shielding film comprising tantalum, the binding state of elemental tantalum is easily controlled.

(Configuration 4A)

Configuration 4A of the present invention is the mask blank described in any of Configurations 1A to 3A, wherein the light shielding film comprises a material that further contains nitrogen. Oxidation of tantalum can be inhibited by containing nitrogen in a light shielding film comprising tantalum.

(Configuration 5A)

Configuration 5A of the present invention is the mask blank described in any of Configurations 1A to 3A, wherein the light shielding film has a laminated structure of a lower layer and an upper layer in this order starting from the side of the transparent substrate, and the highly oxidized layer is formed on the surface layer of the upper layer on the opposite side from the lower layer. As a result of employing this configuration, the upper layer can be made to function as a film having a function that controls surface reflectance of the light shielding film with respect to exposure light (antireflective film).

(Configuration 6A)

Configuration 6A of the present invention is the mask blank described in Configuration 5A, wherein the oxygen content of the upper layer is less than the oxygen content of the highly oxidized layer. As a result, the total thickness of the light shielding film can be further reduced while increasing the optical density obtained by the upper layer, and surface reflectance of the light shielding film can be reduced.

(Configuration 7A)

Configuration 7A of the present invention is the mask blank described in Configuration 6A, wherein the oxygen content of the upper layer is not less than 67 at % and the oxygen content in the portion of the upper layer other than the highly oxidized layer is not less than 50 at %. In the case the highly oxidized layer with a material that contains tantalum is made to contain oxygen at not less than 67 at %, the ratio of the $Ta_2O_5$ bonding state theoretically increases. In addition, in the case the upper layer with a material that contains tantalum is made to contain oxygen at not less than 50 at %, all of the tantalum in the upper layer is theoretically bound to oxygen. An upper layer having a small amount of tantalum that does not bound to oxygen in this manner has resistance to dry etching with a chlorine-based etching gas without containing oxygen.

(Configuration 8A)

Configuration 8A of the present invention is the mask blank described in any of Configurations 5A to 7A, wherein the ratio of the presence of $Ta_2O_5$ bonding in the highly oxidized layer is higher than the ratio of the presence of $Ta_2O_5$ bonding in the upper layer. $Ta_2O_5$ bonding is a bonding state having extremely high stability, and as a result of increasing the ratio of the presence of $Ta_2O_5$ bonding in the highly oxidized layer, resistance to dry etching with a mixed gas of a chlorine-based gas and oxygen gas increases considerably.

(Configuration 9A)

Configuration 9A of the present invention is the mask blank described in any of Configurations 5A to 8A, wherein the oxygen content of the lower layer is less than 10 at %. As a result of considerably suppressing the oxygen content of the lower layer composed of a material containing tantalum, the dry etching rate with a chlorine-based gas without containing oxygen can be increased.

(Configuration 10A)

Configuration 10A of the present invention is the mask blank described in any of Configurations 5A to 9A, wherein the lower layer comprises a material that contains nitrogen. Oxidation of tantalum can be inhibited by containing nitrogen in a lower layer comprising tantalum.

(Configuration 11A)

Configuration 11A of the present invention is the mask blank described in any of Configurations 5A to 10A, wherein the oxygen content of the etching mask film is not less than 40 at %. If the oxygen content in the etching mask film is not less than 40 at %, the etching rate with respect to a chlorine-based gas without containing oxygen becomes equal to or greater than a prescribed value. As a result, the etching mask film is easily removed simultaneous to dry etching of the lower layer.

(Configuration 12A)

Configuration 12A of the present invention is the mask blank described in Configuration 11A, wherein the thickness of the etching mask film is not more than 7 nm. If the thickness of the etching mask film is not more than 7 nm, the etching mask film is easily removed simultaneous to dry etching of the lower layer.

(Configuration 13A)

Configuration 13A of the present invention is a transfer mask fabricated using the mask blank described in any of Configurations 1A to 12A. Use of the mask blank of the present invention makes it possible to obtain a transfer mask having a highly precise transfer pattern and a light shielding film having favorable optical properties.

(Configuration 14A)

Configuration 14A of the present invention is a method of manufacturing a transfer mask that uses the mask blank described in any of Configurations 1A to 4A, comprising the steps of:

forming a resist film having a transfer pattern on the etching mask film;

forming a transfer pattern in the etching mask film by using the resist film in which the transfer pattern has been formed as a mask and dry etching using a mixed gas of a chlorine-based gas and oxygen gas;

forming a transfer pattern in the light shielding film by dry etching using the resist film or etching mask film in which the transfer pattern has been formed as a mask; and removing the etching mask film by dry etching using a mixed gas of a chlorine-based gas and oxygen gas after having formed a transfer pattern in the light shielding film. According to the manufacturing method of the present invention, a transfer mask that has a highly precise transfer pattern and a light shielding film having favorable optical properties, can be fabricated.

(Configuration 15A)

Configuration 15A of the present invention is a method of manufacturing a transfer mask that uses the mask blank described in any of Configurations 5A to 11A, comprising the steps of:

forming a resist film having a transfer pattern on the etching mask film;

forming a transfer pattern in the etching mask film by using the resist film having the transfer pattern as a mask and dry etching using a mixed gas of a chlorine-based gas and oxygen gas;

forming a transfer pattern in the upper layer by using the resist film or etching mask film in which the transfer pattern has been formed as a mask, and dry etching using a fluorine-based gas;

forming a transfer pattern in the lower layer by using the resist film, etching mask film or upper layer in which the transfer pattern has been formed as a mask, and dry etching using chlorine-based gas substantially without containing oxygen; and removing the etching mask film by dry etching using a mixed gas of a chlorine-based gas and oxygen gas after having formed a transfer pattern in the lower layer. According to the manufacturing method of the present invention, a transfer mask that has a highly precise transfer pattern and a light shielding film having favorable optical properties, can be fabricated.

(Configuration 16A)

Configuration 16A of the present invention is a method of manufacturing a transfer mask, which uses the mask blank described in Configuration a method of manufacturing 12A, comprising the steps of:

forming a resist film having a transfer pattern on the etching mask film;

forming a transfer pattern in the etching mask film by using the resist film having the transfer pattern as a mask and dry etching using a mixed gas of a chlorine-based gas and oxygen gas;

removing the resist film;

forming a transfer pattern in the upper layer by using the etching mask film in which the transfer pattern has been formed as a mask, and dry etching using a fluorine-based gas; and forming a transfer pattern in the lower layer by using the upper layer in which the transfer pattern has been formed as a mask and dry etching using chlorine-based gas substantially without containing oxygen, and removing the etching mask film. According to the manufacturing method of the present invention, a transfer mask that has a highly precise transfer pattern and a light shielding film having favorable optical properties, can be fabricated.

(Configuration 17A)

Configuration 17A of the present invention is a method of manufacturing a semiconductor device, comprising exposing and transferring a transfer pattern to a resist film on a semiconductor substrate using the transfer mask described in Configuration 13A. According to the present invention, a semiconductor device that is without wiring short circuits and disconnections in circuit patterns attributable to inadequate overlay accuracy, can be obtained.

(Configuration 18A)

Configuration 18A of the present invention is a method of manufacturing a semiconductor device, comprising exposing and transferring a transfer pattern to a resist film on a semiconductor substrate using a transfer mask fabricated according to the method of manufacturing the transfer mask described in any of Configurations 14A to 16A. According to the present invention, a semiconductor device that is without wiring short circuits and disconnections in circuit patterns attributable to inadequate overlay accuracy, can be obtained.

According to the present invention, a mask blank can be obtained, which allows the fabrication of a transfer mask that has a highly precise transfer pattern and a light shielding film having favorable optical properties by using a mask blank obtained by laminating a light shielding film of a tantalum-based material and an etching mask film of a chromium-based material. In addition, according to the present invention, a transfer mask having a highly precise transfer pattern and a light shielding film having favorable optical properties, and a manufacturing method thereof, can be obtained. In addition, use of a transfer mask that uses the mask blank of the present invention makes it possible to produce a semiconductor device that is without wiring short circuits and disconnections in circuit patterns attributable to inadequate overlay accuracy.

More specifically, the mask blank of the present invention has a light shielding film composed of a material containing tantalum, and has a highly oxidized layer having an oxygen content of not less than 60 at % is formed on the surface layer of the light shielding film on the opposite side from a transparent substrate. The mask blank also adopts a structure in which an etching mask film composed of a material containing chromium is formed on the light shielding film. A mask blank adopting such a structure makes it possible to fabricate a transfer mask having favorable optical properties for the light shielding film pattern even if the etching mask film is stripped by dry etching using a mixed gas of a chlorine-based gas and oxygen gas after forming a transfer pattern in the light shielding film. In addition, a transfer mask that has favorable line edge roughness of a transfer pattern formed in the light shielding film, can be fabricated. In addition, by exposing and transferring to a resist film on a semiconductor device using a transfer mask fabricated from this mask blank, a resist pattern can be formed with high precision on a semiconductor device.

More specifically, the mask blank of the present invention has a light shielding film composed of a material containing tantalum, and a highly oxidized layer is formed on the surface layer of the light shielding film on the opposite side from a transparent substrate, a Ta 4 f narrow spectrum of the highly oxidized layer analyzed by X-ray photoelectron spectroscopy has a maximum peak at a binding energy of more than 23 eV. The mask blank adopts a structure in which an etching mask film composed of a material containing chromium is formed on the light shielding film. The use of a mask blank adopting such a structure makes it possible to fabricate a transfer mask having favorable optical properties of the light shielding film pattern even if the etching mask film is stripped by dry etching using a mixed gas of a chlorine-based gas and oxygen gas after forming a transfer pattern in the light shielding film. In addition, a transfer mask that has favorable line edge roughness of a transfer pattern formed in the light shielding film, can be fabricated. In addition, by exposing and transferring to a resist film on a semiconductor device using a transfer mask fabricated from this mask blank, a resist pattern can be formed with high precision on a semiconductor device.

DETAILED DESCRIPTION OF THE INVENTION

Figure 1:
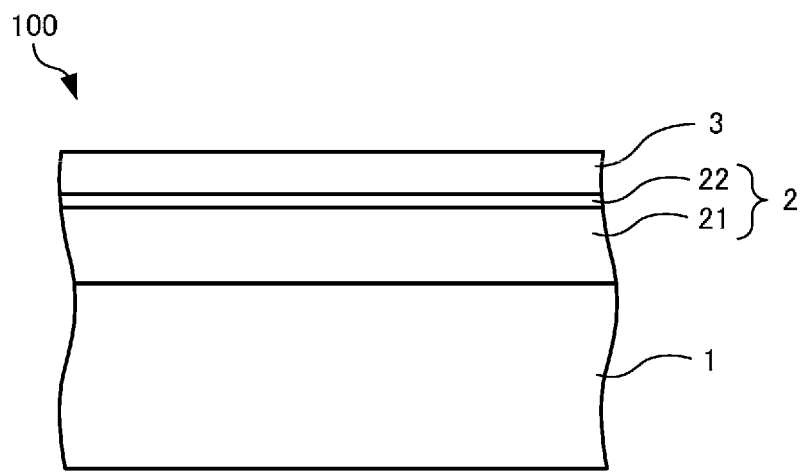
FIG. 1 is a cross-sectional view showing the configuration of a mask blank in a first embodiment of the present invention.
Figure 2A:
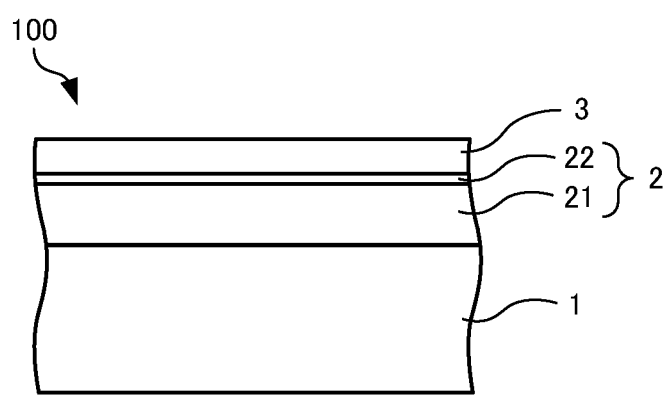
FIGS. 2A to 2F are cross-sectional views showing the manufacturing process of a transfer mask in a first embodiment of the present invention.
Figure 2B:
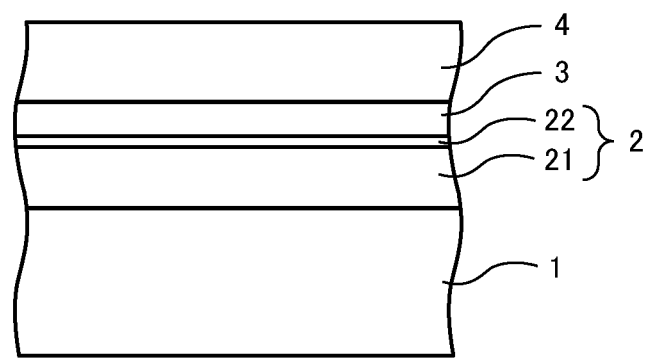
Figure 2C:
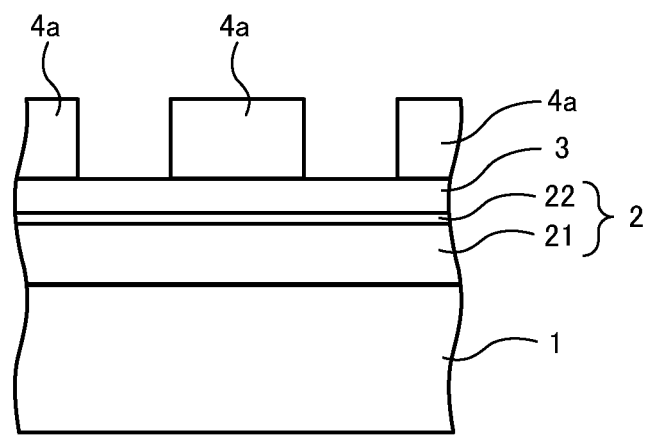
Figure 2D:
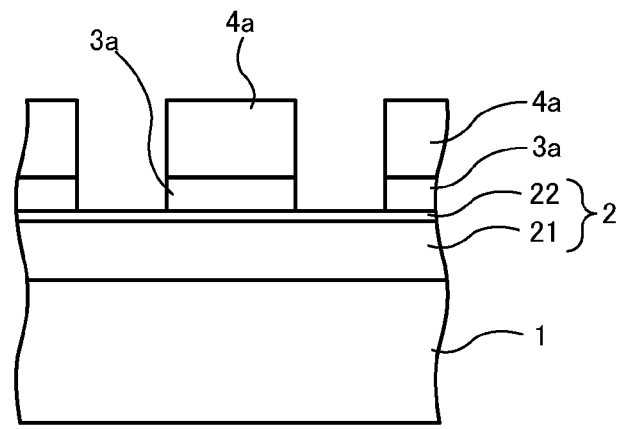
Figure 2E:
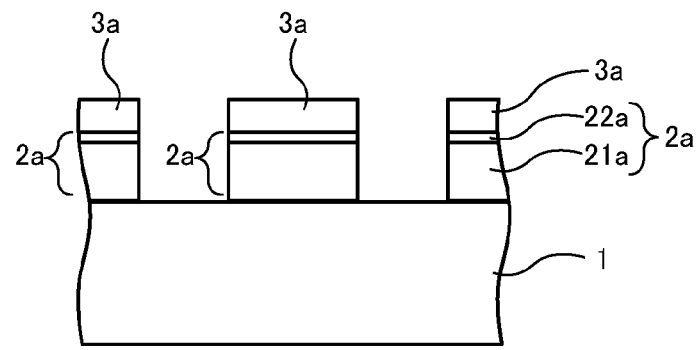
Figure 2F:
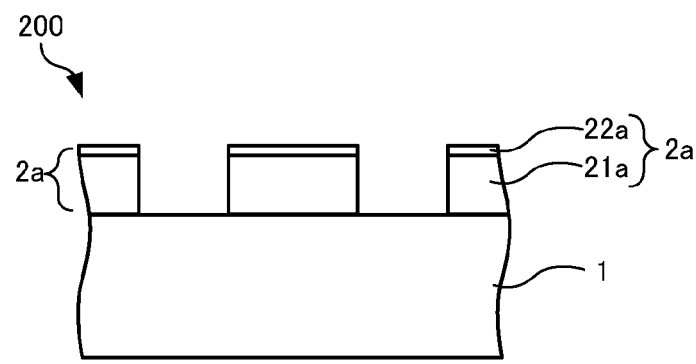

The following provides an explanation of various embodiments of the present invention.

The inventors of the present invention conducted extensive studies to solve problems occurring in the case of fabricating a transfer mask using a mask blank obtained by laminating an etching mask film composed of a material containing chromium on a light shielding film composed of a material containing tantalum. The problems are degradation of optical properties of the light shielding film (including poor surface reflectance and optical density) as a result of the surface of the light shielding film on the side of the etching mask film being affected by dry etching with a mixed gas of a chlorine-based gas and oxygen gas during removal of the etching mask film, and degradation of line edge roughness of the light shielding film due to rounding of the pattern edges of the light shielding film. As a result the studies, the inventors of the present invention determined that, if a material containing tantalum has an oxygen content of at least 60 atomic percent (at %), resistance to dry etching with a mixed gas of a chlorine-based gas and oxygen gas can be adequately enhanced, and that a light shielding film formed with that material is able to inhibit effects on optical properties and rounding of pattern edges. However, the light shielding film is required to be optical density equal to or greater than a prescribed value (such as an optical density of not less than 2.5). On the other hand, since miniaturization of transfer patterns is progressing, it is also necessary to reduce the thickness of the light shielding film. If the entire light shielding film is formed with a material having a high oxygen concentration in this manner, it becomes necessary to increase the thickness of the light shielding film in order to obtain optical density equal to or more than a prescribed value.

In consideration of the above, the mask blank in a first embodiment of the present invention is characterized by being a mask blank used to fabricate a transfer mask and having a structure in which a light shielding film and an etching mask film are laminated in this order on a transparent substrate, wherein the etching mask film comprises a material containing chromium, the light shielding film comprises a material containing tantalum, and a highly oxidized layer having an oxygen concentration of not less than 60 at % is formed on the surface layer of the light shielding film on the opposite side from the transparent substrate.

It is desired that the crystal structure of the thin film in the mask blank and the transfer mask is microcrystalline and preferably amorphous. Consequently, the crystal structure in the light shielding film is unlikely to become a single structure, and easily becomes a state comprising a mixture of a plurality of crystal structures. Namely, in the case the material containing tantalum is a highly oxidized layer, the crystal structure easily becomes a state comprising a mixture of TaO bonding, $Ta_2O_3$ bonding, $TaO_2$ bonding and $Ta_2O_5$ bonding (mixed crystalline state). As the ratio of the presence of $Ta_2O_5$ bonding increases in a prescribed surface layer in the light shielding film, resistance to dry etching with a mixed gas of a chlorine-based gas and oxygen gas tends to improve. In addition, as the ratio of the presence of $Ta_2O_5$ bonding in a prescribed surface layer of the light shielding film increases, characteristics that inhibit hydrogen penetration, chemical resistance, hot water resistance and ArF photo-resistance also tend to increase.

If the oxygen content in the highly oxidized layer is 60 at % to less than 66.7 at %, there is thought to be an increasingly high tendency for the bonding state between tantalum and oxygen in this layer to comprise mainly of $Ta_2O_3$ bonding, while the presence of most unstable form of bonding in the form of TaO bonding is thought to be extremely low in comparison with the case of an oxygen concentration in the highly oxidized layer of less than 60 at %. If the oxygen content in the highly oxidized layer is not less than 66.7 at %, it is thought that there is an increasingly high tendency with comprising mainly of $TaO_2$ for the bonding state between tantalum and oxygen in this layer, while the presence of the most unstable bonding of TaO bonding and the second most unstable bonding of $Ta_2O_3$ bonding are thought to be extremely low.

If the oxygen content in the highly oxidized layer is not less than 67 at %, it is considered that not only $TaO_2$ becomes the main bonding state but also the ratio of the $Ta_2O_5$ bonding state is increased. In the case of this oxygen content, the $Ta_2O_3$ and $TaO_2$ bonding states are only rarely present, while the TaO bonding state is no longer able to be present. If the oxygen content in the highly oxidized layer reaches 71.4 at %, the highly oxidized layer is thought to be substantially formed only in the $Ta_2O_5$ bonding state. If the oxygen content of the highly oxidized layer is not less than 60 at %, bonding comprises not only the most stable $Ta_2O_5$ bonding state, but also includes the $Ta_2O_3$ and $TaO_2$ bonding states. On the other hand, the lower limit of oxygen content in the highly oxidized layer, which can be said to be an extremely low amount to a degree that the most stable form of TaO bonding does not have an effect on resistance to dry etching with a mixed gas of a chlorine-based gas and oxygen gas, characteristics that inhibit hydrogen penetration, chemical resistance or ArF photo-resistance, is thought to be at least 60 at %.

The ratio of the presence of $Ta_2O_5$ bonding in the highly oxidized layer is preferably higher than the ratio of the presence of $Ta_2O_5$ bonding in the light shielding film. $Ta_2O_5$ bonding is a bonding state having extremely high stability, and by increasing the ratio of the presence of $Ta_2O_5$ bonding in the highly oxidized layer, resistance to dry etching with a mixed gas of a chlorine-based gas and oxygen gas increases considerably. In addition, characteristics that inhibit hydrogen penetration, chemical resistance and resistance related to mask washing, such as hot water resistance, as well as ArF photo-resistance also increase considerably. In particular, the highly oxidized layer is most preferably formed with the $Ta_2O_5$ bonding state only. Furthermore, the highly oxidized layer preferably only contains nitrogen and other elements within a range that does not have an effect on these functions and effects, and are preferably substantially not contained.

On the other hand, as a result of conducting extensive studies on the highly oxidized layer formed on the surface layer on the opposite side from the transparent substrate, the inventors of the present invention determined that the various problems previously described can be solved by forming the highly oxidized layer that has the Ta 4 f narrow spectrum analyzed by X-ray photoelectron spectroscopy (XPS) having a maximum peak at a binding energy of more than 23 eV. Materials having a high binding energy tend to have improved resistance to dry etching with a mixed gas of a chlorine-based gas and oxygen gas. In addition, characteristics that inhibit hydrogen penetration, chemical resistance, hot water resistance and ArF photo-resistance also tend to increase. The bonding state that has the highest binding energy in tantalum compounds is $Ta_2O_5$ bonding. As was previously described, the crystal structure of the thin film in the mask blank and the transfer mask is unlikely to become a single structure, and easily becomes a state comprising a mixture of a plurality of crystal structures.

As the ratio of the presence of $Ta_2O_5$ bonding in the highly oxidized layer increases, the above-mentioned various properties improve. As previously described, the ratio of the presence of $Ta_2O_5$ bonding can be promoted to increase by controlling the oxygen content therein. However, in order to more reliably form a highly oxidized layer having a high ratio of the presence of $Ta_2O_5$ bonding, it is better to control the oxygen content by analyzing the actually formed highly oxidized layer by X-ray photoelectron spectroscopy and observing the Ta 4 f narrow spectrum. For example, a plurality of conditions is set for the deposition conditions of a sputter deposition system and treatment conditions of surface treatment for forming the highly oxidized layer, and mask blanks in which a highly oxidized layer is formed on the surface layer of the light shielding film are respectively produced under each condition. The highly oxidized layer of each mask blank is then analyzed by X-ray photoelectron spectroscopy to observe the Ta 4 f narrow spectrum, conditions for forming a highly oxidized layer having high binding energy are selected, and a mask blank provided with a highly oxidized layer formed under the selected conditions is produced on the surface layer of the light shielding film. In a mask blank produced in this manner, the ratio of the presence of $Ta_2O_5$ bonding in the highly oxidized layer formed on the surface layer of the light shielding film is reliably increased.

The Ta 4 f narrow spectrum of the highly oxidized layer of the mask blank of the present invention analyzed by X-ray photoelectron spectroscopy has a maximum peak at a binding energy of more than 23 eV. This is because it is less likely that $Ta_2O_5$ bonding is present in a material containing tantalum in which the maximum peak of the binding energy is not more than 23 eV. The maximum peak of the binding energy in the Ta 4 f narrow spectrum of the highly oxidized layer of the mask blank of the present invention analyzed by X-ray photoelectron spectroscopy is preferably not less than 24 eV, more preferably not less than 25 eV and particularly preferably not less than 25.4 eV. If the maximum peak of the binding energy of the highly oxidized layer is not less than 25 eV, the binding state between tantalum and oxygen in the highly oxidized layer comprise mainly of $Ta_2O_5$ bonding, and resistance to dry etching with a mixed gas of a chlorine-based gas and oxygen gas increases considerably.

In the mask blank of the present invention, the Ta 4 f narrow spectrum of the portion of the light shielding film other than the highly oxidized layer analyzed by X-ray photoelectron spectroscopy preferably has a maximum peak at a binding energy of not more than 23 eV. As the binding energy of the Ta 4 f narrow spectrum increases, the ratio of bonding between tantalum and oxygen in the light shielding film increases and optical density of the light shielding film per unit thickness with respect to exposure light ends up decreasing. Consequently, the thickness of the light shielding film required to obtain a prescribed optical density increases, thereby making this undesirable. The maximum peak of binding energy in the portion of the light shielding film other than the highly oxidized layer is more preferably not more than 22.6 eV and even more preferably not more than 22 eV.

In the mask blank of the present invention, the light shielding film is preferably composed of a material that does not contain silicon. This is because, as a result of not containing silicon that has properties of easily bonding with oxygen and nitrogen in the light shielding film containing tantalum, it can be easier to control the bonding state between tantalum and oxygen in the highly oxidized layer, in particular. In addition, in the case of using a chlorine-based gas for the etching gas used during dry etching carried out, when a transfer pattern is formed in the light shielding film, the etching rate decreases considerably if chlorine is contained in the light shielding film, thereby making this undesirable.

The thickness of the highly oxidized layer of the mask blank of the present invention is preferably 1.5 nm to 4 nm. In the case the thickness of the highly oxidized layer is less than 1.5 nm, the highly oxidized layer becomes excessively thin and cannot be expected to demonstrate the effects, while if the thickness of the highly oxidized layer exceeds 4 nm, the effect on surface reflectance becomes great, and control for obtaining a prescribed surface reflectance (surface reflectance with respect to exposure light and reflectance spectra with respect to light at various wavelengths) becomes difficult. In addition, since optical density of the highly oxidized layer with respect to ArF exposure light is extremely low, this ends up having a negative effect from the viewpoint of decreasing the thickness of the light shielding film. Furthermore, in consideration of balance between the viewpoint of obtaining optical density throughout the entire light shielding film and the viewpoint of improving characteristics that inhibit hydrogen penetration, chemical resistance and ArF photo-resistance, the thickness of the highly oxidized layer is more preferably 1.5 nm to 3 nm.

Examples of methods for forming the highly oxidized layer include carrying out hot water treatment, ozone water treatment, heat treatment in air containing oxygen, ultraviolet irradiation treatment in air containing oxygen and $O_2$ plasma treatment on the mask blank after the formation of the light shielding film.

The light shielding film is required to have a prescribed optical density (OD) with respect to exposure light. In the case of applying an ArF excimer laser for the exposure light, the optical density of the light shielding film is required to be not less than 2.5, preferably not less than 2.8 and more preferably not less than 3.0 at the wavelength (approximately 193 nm).

Examples of tantalum-containing materials that form the light shielding film include tantalum metal and materials containing one or more elements selected from the group consisting of nitrogen, oxygen, boron and carbon in tantalum but substantially without containing hydrogen. Examples of these materials include Ta, TaN, TaON, TaBN, TaBON, TaCN, TaCON, TaBCN and TaBOCN. The aforementioned materials may also contain metals other than tantalum within a range that allows the effects of the present invention to be obtained.

The light shielding film of the mask blank is preferably formed with a material containing tantalum and nitrogen. Tantalum is a material that is susceptible to natural oxidation. As oxidation progresses, the light shielding performance (optical density) of tantalum with respect to exposure light decreases. In addition, from the viewpoint of forming a light shielding film pattern, in the case of being in a state in which oxidation has not progressed, tantalum can be said to be a material that can be dry etched with either an etching gas containing a fluorine-based gas (fluorine-based etching gas) or an etching gas containing a chlorine-based gas but without oxygen (oxygen-free, chlorine-based etching gas). However, from the viewpoint of forming a light shielding film pattern, tantalum in which oxidation has progressed can be said to be a material for which dry etching is difficult with an oxygen-free, chlorine-based etching gas, and can only be dry etched with a fluorine-based gas. Oxidation of tantalum can be controlled by containing nitrogen in the tantalum. In addition, it is preferable to form a light shielding film composed of a material containing tantalum in contact with the main surface of a transparent substrate, because it possible to reduce surface reflectance with respect to exposure light with containing nitrogen in the material, and also it is possible to inhibit decreasing optical density in comparison with the case of containing oxygen.

From the viewpoint of optical density, the oxygen content of the light shielding film is preferably not more than 30 at %, more preferably not more than 25 at % and even more preferably not more than 20 at %. The nitrogen content of the light shielding film is preferably not less than 5 at %. In addition, in the case backside surface reflectance is required to be less than 40%, the oxygen content of the light shielding film is preferably not less than 7 at %.

Examples of chromium-containing materials that form the etching mask film include materials containing one or more elements selected from the group consisting of nitrogen, oxygen, carbon and boron in chromium. Examples of these materials include CrN, CrON, CrCN, CrCON, CrBN, CrBON, CrBCN and CrBOCN. The aforementioned materials may also contain metals other than chromium within a range that allows the effects of the present invention to be obtained. From the viewpoint of allowing functioning as an etching mask in which a transfer pattern is precisely formed on the light shielding film, the thickness of the etching mask film is preferably not less than 4 nm. In addition, from the viewpoint of reducing the thickness of the resist film, the thickness of the etching mask film is preferably not more than 15 nm.

Examples of the transparent substrate in the mask blank include synthetic quartz glass as well as quartz glass, aluminosilicate glass, soda lime glass and low thermal expansion glass (such as $SiO_2$—$TiO_2$ glass). The synthetic quartz glass is particularly preferable since it has high transmittance with respect to ArF excimer laser light (wavelength: 193 nm). Furthermore, there are no particular limitations on the exposure light applied to the mask blank and transfer mask of the present invention, and specific examples thereof include ArF excimer laser light, KrF excimer laser light and i-line light. A mask blank or transfer mask in which an ArF excimer laser is applied for the exposure light is particularly effective since the required level of main surface flatness or positional accuracy of transfer patterns formed with a thin film and the like is extremely high.

A method of manufacturing a transfer mask that uses the mask blank of the first embodiment of the present invention is characterized by having a step of forming a resist film having a transfer pattern on an etching mask film, a step of forming a transfer pattern in the etching mask film by using the resist film in which the transfer pattern has been formed as a mask and dry etching using a mixed gas of a chlorine-based gas and oxygen gas, a step of forming a transfer pattern in the light shielding film by using the resist film or etching mask film in which the transfer pattern has been formed as a mask and dry etching using a fluorine-based gas, and a step of removing the etching mask film by dry etching using a mixed gas of a chlorine-based gas and oxygen gas after having formed a transfer pattern in the light shielding film.

FIG. 1 is a cross-sectional view showing the configuration of a mask blank 100 in a first embodiment of the present invention. In addition, FIGS. 2A to 2F are cross-sectional views showing the production process of a transfer mask 200 using the mask blank 100. This mask blank 100 has a configuration in which a light shielding film 2 and an etching mask film 3 are laminated on a transparent substrate 1, and a highly oxidized layer 22 is formed on the surface layer of the light shielding film 2 on the opposite side from the transparent substrate 1 (side toward to the etching mask film 3). The portion of the light shielding film 2 excluding the highly oxidized layer 22 is a light shielding film body 21. The details of each configuration of the mask blank 100 are as previously described. The following provides an explanation of a method of manufacturing a transfer mask in accordance with the production process shown in FIG. 2.

Figure 4A:
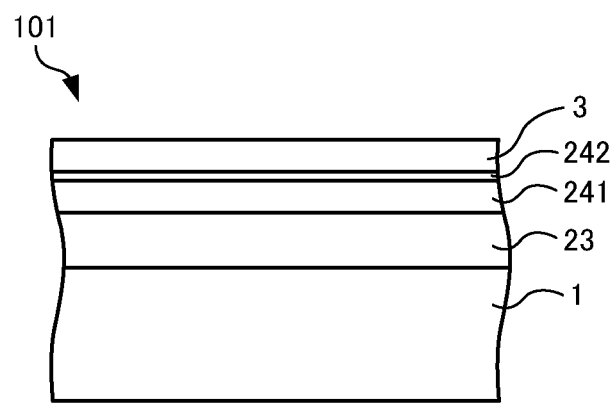
FIGS. 4A to 4G are cross-sectional views showing the manufacturing process of a transfer mask in a second embodiment of the present invention.
Figure 4B:
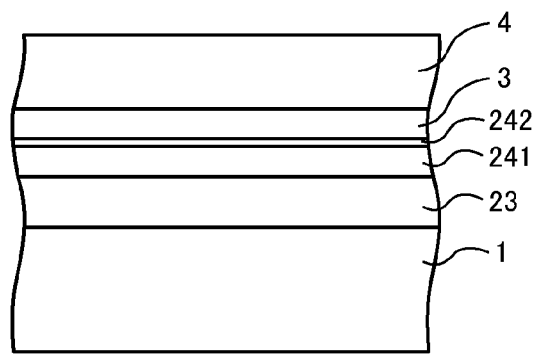
Figure 4C:
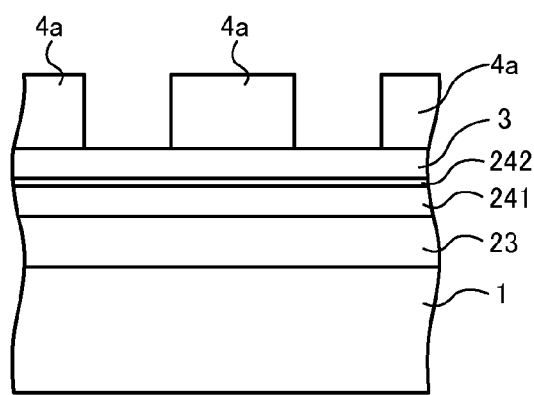
Figure 4D:
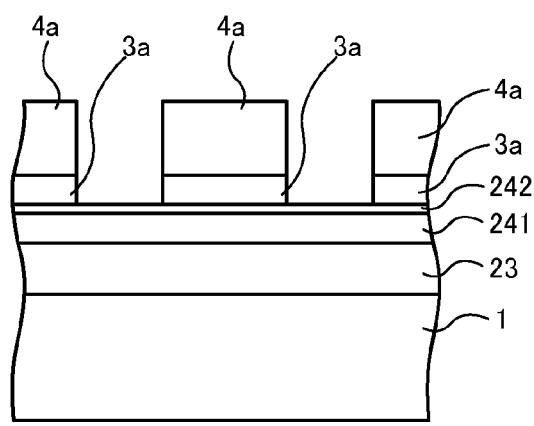
Figure 4E:
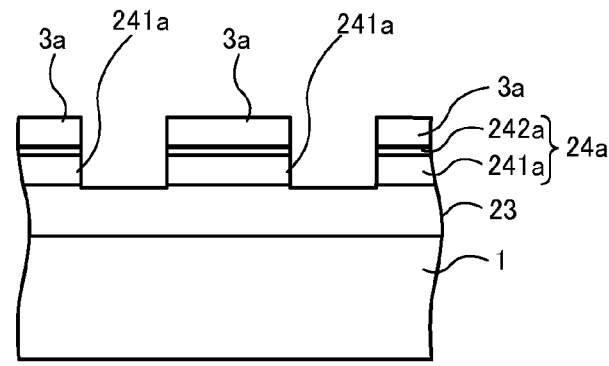

First, a resist film 4 is formed on the etching mask film 3 of the mask blank 100 (see FIG. 4B). Next, a desired transfer pattern is formed by exposure drawing on the resist film 4 followed by carrying out prescribed treatment such as development treatment to form the resist film 4 having a transfer pattern (resist pattern 4a) (see FIG. 4C). Continuing, a transfer pattern is formed on the etching mask film 3 (etching mask pattern 3a) by using the resist pattern 4a as a mask and carrying out dry etching using a mixed gas of a chlorine-based gas and oxygen gas (see FIG. 4D). Next, the resist pattern 4a is removed, and dry etching is carried out using a fluorine-based gas by using the etching mask pattern 3a as a mask to form a transfer pattern (light shielding film pattern 2a) on the light shielding film 2 (the highly oxidized layer 22 and the light shielding film body 21) (see FIG. 4E). Furthermore, the resist pattern 4a may be allowed to remain when dry etching is carried out on the light shielding film 2. In that case, the resist pattern 4a is removed after having formed the light shielding film pattern 2a. After having formed the light shielding film pattern 2a, dry etching is carried out using a mixed gas of a chlorine-based gas and oxygen gas to remove the etching mask pattern 3a followed by undergoing a desired treatment such as washing to obtain the transfer mask 200 (see FIG. 4F).

As described above, the surface of the light shielding film 2 (highly oxidized layer 22) has high resistance even if dry etching is carried out using a mixed gas of a chlorine-based gas and oxygen gas when the etching mask pattern 3a is removed. Consequently, in-plane uniformity of surface reflectance of the light shielding film pattern 2a of the fabricated transfer mask 200 is high and other optical properties are favorable. In addition, line edge roughness of the light shielding film pattern 2a is also favorable. This is particularly preferable since transfer masks used in double patterning technology (such as double patterning (DP) technology in the narrow sense or double exposure (DE) technology), which are required to be applied from DRAM equivalent to hp 32 nm generation, require an extremely high level of pattern precision. Furthermore, although the light shielding film pattern 2a was formed on the light shielding film 2 by carrying out dry etching using a fluorine-based gas, dry etching using a chlorine-based gas may also be applied.

There are no particular limitations on the chlorine-based gas used in the aforementioned dry etching, if the chlorine-based gas contains Cl. Examples of such gases include $Cl_2$, $SiCl_2$, $CHCl_3$, $CH_2Cl_2$, $CCl_4$ and $BCl_3$. In addition, there are also no particular limitations on the fluorine-based gas used in the aforementioned dry etching, if the fluorine-based gas contains F. Examples of these gases include $CHF_3$, $CF_4$, $C_2F_6$, $C_4F_8$ and $SF_6$. In particular, etching gas containing C and F has a high etching rate with respect to materials containing tantalum. On the other hand, since fluorine-based gas without containing C has a comparatively low etching rate with respect to glass substrates, damage to glass substrates can be further reduced.

Furthermore, in the aforementioned method of manufacturing the transfer mask, after forming a transfer pattern on the etching mask film 3, dry etching for forming a transfer pattern on the light shielding film 2 is preferably carried out after removing the resist pattern 4a. Since transfer patterns are of a fine size, the resist film 4 is preferably as thin as possible. If dry etching is carried out on the light shielding film 2 with the resist pattern 4a remaining after having patterned the etching mask film 3 with a thin resist pattern 4a, there is the risk of the resist pattern 4a being lost during etching of the light shielding film 2. If a resist pattern 4a of an organic material is present during dry etching, carbon and/or oxygen are generated when the resist pattern 4a is etched, and they have an effect on the etching environment when dry etching of the light shielding film 2 is carried out. If the resist pattern 4a containing carbon and/or oxygen is lost at an intermediate point during dry etching of the light shielding film 2, the etching environment ends up changing during the course of dry etching, thereby resulting in the risk of having a detrimental effect on pattern precision (such as the precision of the shape of pattern sidewalls or in-plane CD precision), and making this undesirable.

In addition, since the etching gas used for dry etching of the etching mask film 3 and the etching gas used for dry etching of the light shielding film 2 are different, etching is frequently carried out in separate etching chambers. The generation of carbon and oxygen originating in the resist pattern can cause the occurrence of defects during dry etching. Consequently, after having patterned the etching mask film 3 and after removing the resist pattern 4a, the mask blank 100 is preferably introduced into an etching chamber for dry etching the light shielding film 2.

A mask blank in a second embodiment of the present invention adopts a configuration in which the light shielding film in the mask blank of the first embodiment has a structure in which a lower layer and an upper layer are laminated starting from the side of a transparent substrate, and a highly oxidized layer is formed on the surface layer of the upper layer on the opposite side from the lower layer. When such a configuration is adopted, the upper layer can be a film having a function that controls surface reflectance of the light shielding film with respect to exposure light (antireflective film). The specific configuration, functions and effects relating to the highly oxidized layer are the same as in the mask blank of the first embodiment. In addition, the specific configuration relating to the transparent substrate is also the same as that of the mask blank of the first embodiment.

The oxygen content of the upper layer is preferably lower than the oxygen content of the highly oxidized layer. As a result of adopting such a configuration for the light shielding film, the overall thickness of the light shielding film can be further reduced while increasing the optical density obtained by the upper layer and reducing surface reflectance of the light shielding film. When considering ease of controlling surface reflectance properties (reflectance with respect to ArF exposure light and reflectance spectra with respect to light at each wavelength), the oxygen content of the upper layer is preferably less than 60 at %.

The oxygen content of the upper layer is preferably not less than 50 at %. It is desired that the crystal structure of the light shielding film in the mask blank and the transfer mask is microcrystalline and preferably amorphous. Consequently, the crystal structure within the light shielding film is unlikely to become a single structure, and easily becomes a state comprising a mixture of a plurality of crystal structures. Namely, in the case of a highly oxidized layer of a material containing tantalum, the crystal structure easily becomes a state comprising oxygen and unbound Ta, TaO bonding, $Ta_2O_3$ bonding, $TaO_2$ bonding and $Ta_2O_5$ bonding (mixed crystalline state). In the case the upper layer with the material that contains tantalum contains oxygen at not less than 50 at %, theoretically all of the tantalum in the upper layer is bound to oxygen. The ratio of presence of tantalum without bonding to oxygen in the upper layer can be decreased considerably even in a mixed crystalline state as described above. The upper layer which contains little tantalum without bonding to oxygen in this manner has resistance to dry etching with an oxygen-free, chlorine-based etching gas.

The oxygen content of the highly oxidized layer is preferably not less than 67 at %, and the oxygen content in the portion of the upper layer other than the highly oxidized layer is preferably not less than 50 at %. In the case of containing oxygen at not less than 50 at % in the upper layer with a material that contains tantalum, theoretically all of the tantalum in the upper layer is bounding to oxygen. An upper layer having little tantalum without bonding to oxygen in this manner has resistance to dry etching with an oxygen-free, chlorine-based etching gas. Moreover, if oxygen is contained at not less than 67 at % in the highly oxidized layer with a material that contains tantalum, theoretically the ratio of the $Ta_2O_5$ bonding state increases. As a result of providing a highly oxidized layer having a high ratio of the $Ta_2O_5$ bonding state on the surface layer of the upper layer, resistance of the surface of the upper layer to dry etching with a mixed gas of a chlorine-based gas and oxygen gas increases considerably. In particular, in the case of imparting an antireflection function to the upper layer, changes in surface reflectance can be inhibited after having carried out dry etching for removing the etching mask film of a chromium-based material.

The ratio of the presence of $Ta_2O_5$ bonding in the highly oxidized layer is preferably higher than the ratio of the presence of $Ta_2O_5$ bonding in the upper layer. $Ta_2O_5$ bonding is a bonding state having extremely high stability, and by increasing the ratio of the presence of $Ta_2O_5$ bonding in the highly oxidized layer, resistance to dry etching with a mixed gas of a chlorine-based gas and oxygen gas increases considerably.

In addition, the oxygen content of the lower layer is preferably less than 10 at %. As a result of greatly reducing the oxygen content of the lower layer composed of a material containing tantalum, the dry etching rate with an oxygen-free, chlorine-based gas can be increased.

The thickness of the resist film can be further reduced by combining the upper layer having an oxygen content of not less than 50 at % and a lower layer having an oxygen content of less than 10 at %. In contrast to the upper layer being difficult to dry etch with an oxygen-free, chlorine-based gas, the lower layer can be sufficiently dry etched with an oxygen-free, chlorine-based gas. Consequently, a transfer pattern can be formed in the lower layer by using the upper layer in which a transfer pattern has been formed as a mask and carrying out dry etching with an oxygen-free, chlorine-based gas. In the case of such a configuration of the light shielding film, it is not essential for the resist pattern to remain until transfer patterns can be formed in both the upper layer and lower layer.

The material that composes the lower layer is the same as the material that composes the light shielding film of the mask blank of the first embodiment. In addition, the material that composes the upper layer contains tantalum, and preferably further contains nitrogen, boron or carbon and the like. Examples of such materials include TaO, TaON, TaBO, TaBON, TaCO, TaCON, TaBCO and TaBOCN.

The lower layer is preferably formed with a material that contains tantalum and nitrogen. Function, effects and the preferable nitrogen content resulting from the use of such a configuration are the same as in the light shielding film of the mask blank of the first embodiment.

A method of manufacturing a transfer mask that uses the mask blank of the second embodiment of the present invention is characterized by having a step of forming a resist film having a transfer pattern on an etching mask film, a step of forming a transfer pattern in the etching mask film by using the resist film in which the transfer pattern has been formed as a mask and dry etching using a mixed gas of a chlorine-based gas and oxygen gas, a step of forming a transfer pattern in the light shielding film by dry etching using the resist film or etching mask film in which the transfer pattern has been formed as a mask, and a step of removing the etching mask film by dry etching using a mixed gas of a chlorine-based gas and oxygen gas after having formed a transfer pattern in the light shielding film.

Figure 3:
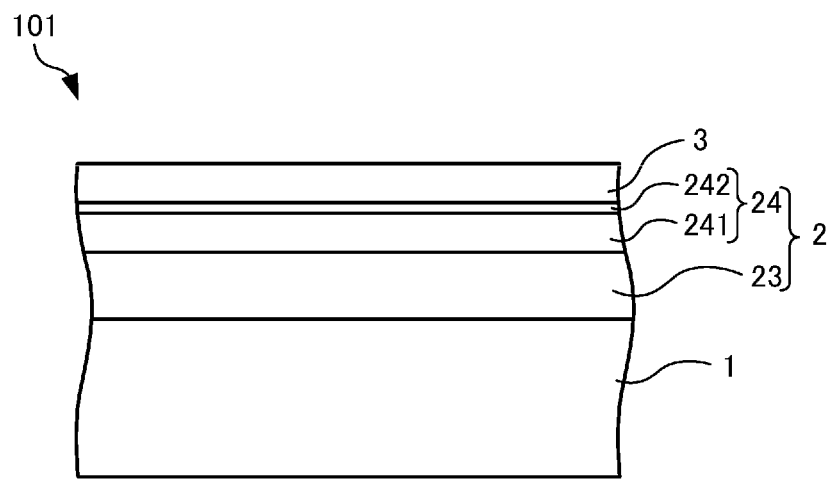
FIG. 3 is a cross-sectional view showing the configuration of a mask blank in a second embodiment of the present invention.

FIG. 3 is a cross-sectional view showing the configuration of a mask blank 101 in a second embodiment of the present invention. In addition, FIGS. 4A to 4G are cross-sectional views showing the production process of a transfer mask 201 using the mask blank 101. This mask blank 101 has a configuration in which a light shielding film 2 provided with a lower layer 23 and an upper layer 24, and an etching mask film 3 are laminated on a transparent substrate 1, and a highly oxidized layer 242 is formed on the surface layer of the upper layer 24 on the opposite side from the lower layer 23 (side toward to the etching mask film 3). The portion of the upper layer 24 excluding the highly oxidized layer 242 is an upper layer body 241. The details of each configuration of the mask blank 101 are as previously described. The following provides an explanation of a method of manufacturing a transfer mask in accordance with the production process shown in FIG. 4.

First, a resist film 4 is formed on the etching mask film 3 of the mask blank 101 (see FIG. 4B). Next, a desired transfer pattern is formed by exposure drawing on the resist film 4 followed by carrying out prescribed treatment such as development treatment to form the resist film 4 having a transfer pattern (resist pattern 4a) (see FIG. 4C). Continuing, a transfer pattern is formed on the etching mask film 3 (etching mask pattern 3a) by using the resist pattern 4a as a mask and carrying out dry etching using a mixed gas of a chlorine-based gas and oxygen gas (see FIG. 4D). Next, the resist pattern 4a is removed, and dry etching is carried out using a fluorine-based gas by using the etching mask pattern 3a as a mask to form a transfer pattern (upper layer pattern 24a) on the upper layer 24 (the highly oxidized layer 242 and the upper layer body 241) (see FIG. 4E). At this time, since the lower layer 23 is formed with a material that is also dry etched with fluorine-based gas, some etching of the top of the lower layer 23 is carried out but it does not present a particular problem. Furthermore, the resist pattern 4a may be allowed to remain when dry etching is carried out on the upper layer 24. In that case, the resist pattern 4a is removed after having formed the light shielding film pattern 2a.

Figure 4F:
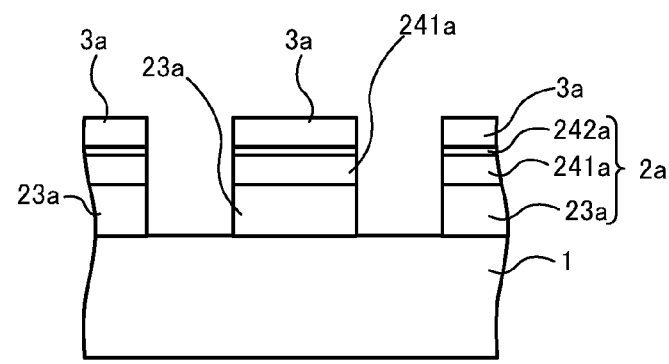
Figure 4G:
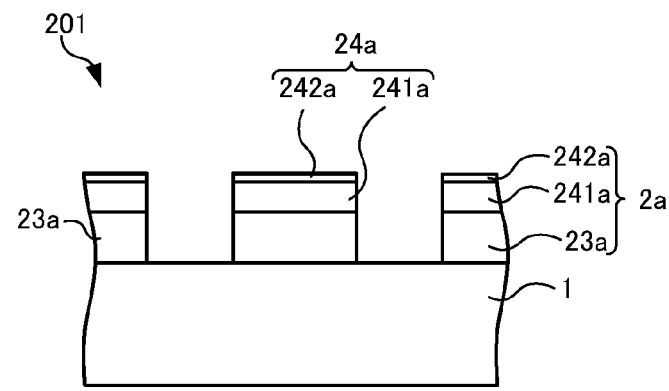

Continuing, a transfer pattern (lower layer pattern 23a) is formed on the lower layer 23 by using the etching mask pattern 3a or the upper layer pattern 24a as a mask and carrying out dry etching using an oxygen-free, chlorine-based gas (see FIG. 4F). As a result of this step, the light shielding film pattern 2a is formed in which the lower layer pattern 23a and the upper layer pattern 24a (highly oxidized layer pattern 242a and upper layer body pattern 241a) are laminated. Moreover, dry etching is carried out using a mixed gas of a chlorine-based gas and oxygen gas to remove the etching mask pattern 3a followed by undergoing a desired treatment such as washing to obtain the transfer mask 201 (see FIG. 4G).

As described above, the surface of the light shielding film 2 (highly oxidized layer 242) has high resistance even if dry etching is carried out using a mixed gas of a chlorine-based gas and oxygen gas when the etching mask pattern 3a is removed. Consequently, in-plane uniformity of surface reflectance of the light shielding film pattern 2a of the fabricated transfer mask 201 is high and other optical properties are favorable. In addition, line edge roughness of the light shielding film pattern 2a is also favorable. This is particularly preferable since transfer masks used in double patterning technology (such as double patterning (DP) technology in the narrow sense or double exposure (DE) technology), which are required to be applied from DRAM equivalent to hp 32 nm generation, require an extremely high level of pattern precision.

Furthermore, although different etching gases were applied to the upper layer and the lower layer in the method of manufacturing the transfer mask of the above-mentioned second embodiment, dry etching may also be carried out with the same etching gas (such as a fluorine-based gas) for the upper layer and the lower layer. Furthermore, the chlorine-based gas and fluorine-based gas used in the above-mentioned dry etching are the same as in the method of manufacturing the transfer mask of the first embodiment.

In addition, when forming a transfer pattern (upper layer pattern 24a) on the upper layer 24 (highly oxidized layer 242 and upper layer body 241), a transfer pattern can be formed on the upper layer 24 by dry etching using a fluorine-based gas while using not only the etching mask film 3, but also the resist film in which a transfer pattern has been formed (resist pattern 4a) as masks. In that case, a transfer pattern (lower layer pattern 23a) can subsequently be formed on the lower layer 23 by carrying out dry etching with a chlorine-based gas substantially without containing oxygen using the resist film in which a transfer pattern has been formed (resist pattern 4a), the etching mask film 3 (etching mask pattern 3a) or the upper layer (upper layer pattern 24a) as a mask. After having formed a transfer pattern (lower layer pattern 23a) on the lower layer 23, the etching mask film 3 can be removed by dry etching using a mixed gas of a chlorine-based gas and oxygen gas.

An experiment was conducted on etching mask films containing chromium to obtain conditions at which the dry etching rate with respect to oxygen-free, chlorine-based gas increases. More specifically, dry etching using a chlorine-based gas ($Cl_2$) without containing oxygen was carried out on eight types of sample films of the chromium-based materials shown in Table 1 followed by determination of each etching rate. The results are shown in FIG. 5.

TABLE 1

| Sample | Film Material | Content in Film (at %) | | | |
|---|---|---|---|---|---|
| | | Cr | O | N | C |
| A | CrO-based | 96.1 | 3.9 | — | — |
| B | Cr(O)N-based | 75.0 | 11.0 | 14.0 | — |
| C | CrOCN-based | 48.9 | 26.4 | 14.1 | 10.6 |
| D | CrO-based | 72.6 | 27.4 | — | — |
| E | CrOCN-based | 33.6 | 38.9 | 16.3 | 11.2 |
| F | CrO-based | 45.5 | 54.5 | — | — |
| G | CrO-based | 40.0 | 60.0 | — | — |
| H | CrO-based | 33.7 | 66.3 | — | — |

Figure 5:
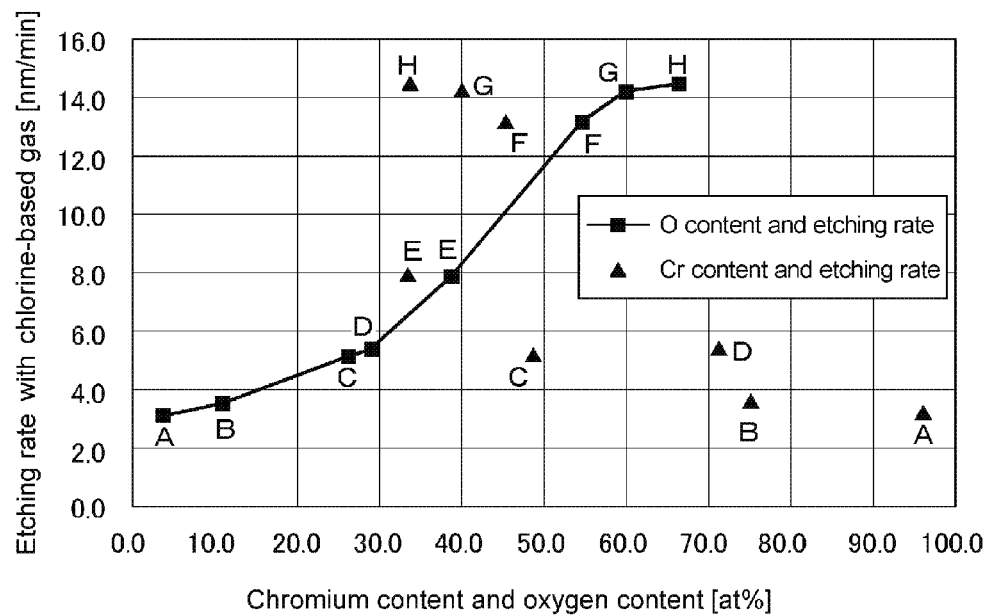
FIG. 5 is a figure showing the relationship between chromium content and oxygen content in an etching mask film and etching rate with chlorine-based gas.

In FIG. 5, the relationship between the oxygen content and the etching rate with oxygen-free, chlorine-based gas for each sample film is plotted and indicated with black squares (■) and the relationship between the chromium content of each film and the etching rate with chlorine-based gas for each sample film is plotted and indicated with black triangles (▲). Furthermore, the letters appended to each plot of black squares (■) and black triangles (▲) in FIG. 5 correspond to letters representing the sample films. According to these results, a correlation is observed between oxygen content and etching rate with oxygen-free, chlorine-based gas. In addition, it is found that the effects of containing nitrogen and carbon in the sample films are also low. On the other hand, it is found that the correlation between chromium content and etching rate with oxygen-free, chlorine-based gas is low.

In addition, according to the results shown in FIG. 5, when the oxygen content in a chromium-based material film is not less than 40 at %, the etching rate with oxygen-free, chlorine-based gas becomes not less than 8.0 nm/min. For example, there could be a case that requires 30 seconds for dry etching with an oxygen-free, chlorine-based gas in order to form a transfer pattern on the lower layer of the light shielding film. In this case, when the etching mask film is formed with a chromium-based material having oxygen content of not less than 40 at %, the etching mask film can be removed simultaneous to dry etching of the lower layer up to a layer thickness of 4 nm. In addition, when the etching mask film is formed with a chromium-based material having oxygen content of not less than 45 at %, the etching mask film can be removed simultaneous to dry etching of the lower layer, if the thickness of the etching mask film is up to 5 nm. When the etching mask film is formed with a chromium-based material having oxygen content of not less than 50 at %, the etching mask film can be removed simultaneous to dry etching the lower layer, if the thickness of the etching mask film is up to 6 nm. When the etching mask film is formed with a chromium-based material having oxygen content of not less than 60 at %, the etching mask film can be removed simultaneous to dry etching the lower layer, if the thickness of the etching mask film is up to 7 nm.

Among the sample films used in the experiment, even in the case of the sample film H having the highest oxygen content, it is difficult to remove the etching mask film simultaneous to dry etching the lower layer under the above-mentioned conditions if the layer thickness of the etching mask film exceeds 7.25 nm. The sample film H has an oxygen content that is theoretically closest to the oxygen content of the most oxidized chromium oxide. On the basis of the aforementioned findings, it is desirable that the etching mask film in the mask blank of the second embodiment is not more than 7 nm, preferably not more than 6 nm and more preferably not more than 5 nm. In addition, the etching mask film composed of a chromium-based material in the mask blank of the second embodiment is preferably at least not less than 4 nm in order to be a minimum prescribed perpendicularity of pattern sidewalls when a transfer pattern is formed. On the basis thereof, it is desirable that the oxygen content of the etching mask film is not less than 40 at %. In addition, the oxygen content of the etching mask film is preferably not less than 45 at %, more preferably not less than 50 at % and even more preferably not less than 60 at %.

The light shielding film of the mask blank in each of the aforementioned embodiments is not limited to the aforementioned laminated structure. The light shielding film may have a three layer structure, may be in the form of a single layer with composition gradient film, or may have a film structure having a composition gradient between the upper layer and the lower layer. A transfer mask fabricated from the mask blank in each of the aforementioned embodiments has favorable line edge roughness and superior pattern precision. Consequently, it is particularly preferable in the case of fabricating a transfer mask set adopting double patterning technology (DP technology or DE technology and the like) that requires extremely high positional accuracy for the light shielding film pattern.

In the aforementioned mask blank, an etching stopper film and/or an etching mask film composed of a material having etching selectivity for the transparent substrate and the light shielding film (material containing Cr such as Cr, CrN, CrC, CrO, CrON or CrC) may be formed between the transparent substrate and the light shielding film. Moreover, a half tone phase shift film having a prescribed phase shift effect and transmittance with respect to exposure light or a light semi-transmitting film having only a prescribed transmittance may be formed between the transparent substrate and the light shielding film (and in this case, the light shielding film is mainly used to form a light shielding band or a light shielding patch).

A highly oxidized layer containing oxygen at not less than 60 at % is also preferably formed on the surface layer of a transfer pattern formed with a thin film of a transfer mask fabricated from the mask blank of each of the embodiments. The form, functions and effects of the highly oxidized layer and a highly oxidized layer of a material containing tantalum and the like are the same as previously described.

EXAMPLES

The following provides an explanation of examples of producing mask blanks and transfer masks according to e the embodiments of the present invention with reference to FIGS. 1 to 4.

Example 1

Production of Mask Blank

A transparent substrate was prepared that was composed of synthetic quartz glass having vertical and horizontal dimensions of about 152 mm×152 mm and having a thickness of about 6.25 mm. The edge faces and main surface of this transparent substrate 1 were polished to a prescribed surface roughness (root mean square roughness Rq: not more than 0.2 nm), and after carrying out prescribed washing treatment and drying treatment, heat treatment (500° C., 40 minutes) was carried out to eliminate hydrogen from the surface layer of the transparent substrate.

Next, the transparent substrate 1 was installed in a single-wafer DC sputtering apparatus and the lower layer 23 (a light shielding layer) composed of TaN was deposited at a layer thickness of 42 nm by reactive sputtering using a tantalum target while introducing a mixed gas of Xe and $N_2$. Continuing, with the transparent substrate 1 still installed in the sputtering apparatus, the gas inside the sputtering apparatus was replaced with a mixed gas of Ar and $O_2$, and the upper layer 24 (antireflective layer) composed of TaO was deposited at a layer thickness of 9 nm by reactive sputtering. As a result of carrying out the aforementioned procedure, a tantalum-based light shielding film 2 having a laminated structure comprising the lower layer 23 composed of TaN and the upper layer 24 composed of TaO, was formed.

Figure 6:
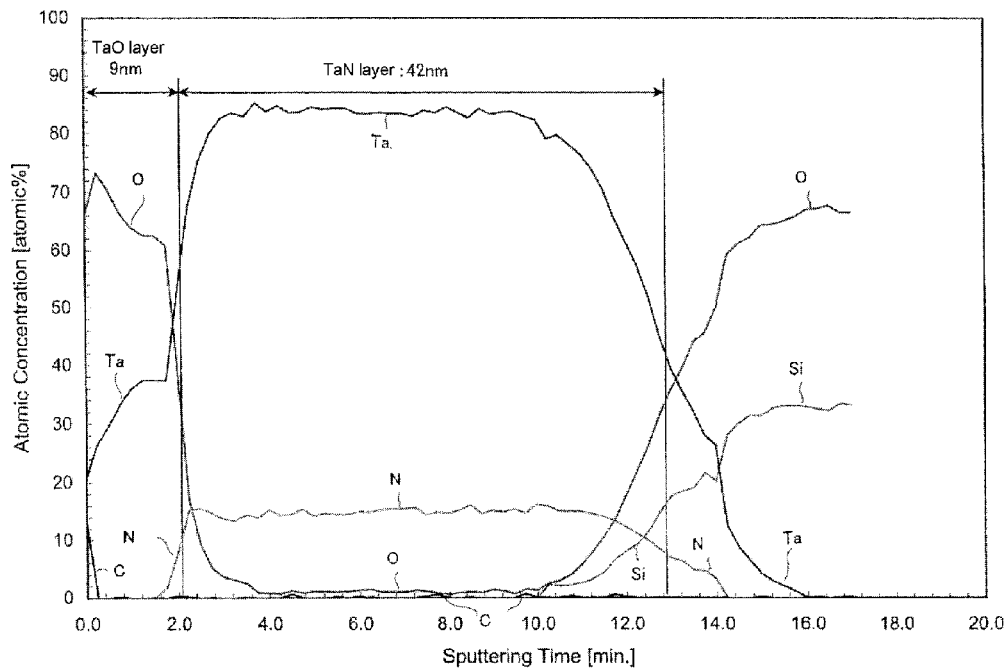
FIG. 6 is a figure showing the results of analyzing a light shielding film of a mask blank in the examples by Auger electron spectroscopy (AES) (depth profile).

Next, hot water treatment (surface treatment) was carried out on the transparent substrate 1 on which the light shielding film 2 composed of a tantalum-based material was formed by immersing for 120 minutes in deionized (DI) water at 90° C. prior to the progression of natural oxidation (such as within 1 hour after deposition) or after storing in an environment in which natural oxidation does not progress after the deposition. The results of carrying out Auger electron spectroscopy (AES) on the light shielding film after the hot water treatment are shown in FIG. 6. From the results, it was confirmed that the highly oxidized layer 242 was formed at a thickness of 2 nm on the surface layer of the upper layer 24. The oxygen content of this highly oxidized layer 242 was 71.4 at % to 67 at %. In addition, the compositions of the other layers are: lower layer (Ta: 86 at %, N: 16 at %), and upper layer body 241 excluding the highly oxidized layer (Ta: 42 at %, O: 58 at %). Furthermore, reflectance on the surface side (surface reflectance) of this light shielding film 2 was 25.1% with respect to ArF exposure light (wavelength: 193 nm). In addition, reflectance of this light shielding film 2 on the side of the transparent substrate 1 was 38.2% with respect to ArF exposure light. The optical density (OD) of this light shielding film 2 with respect to ArF exposure light was 3.06.

Figure 7:
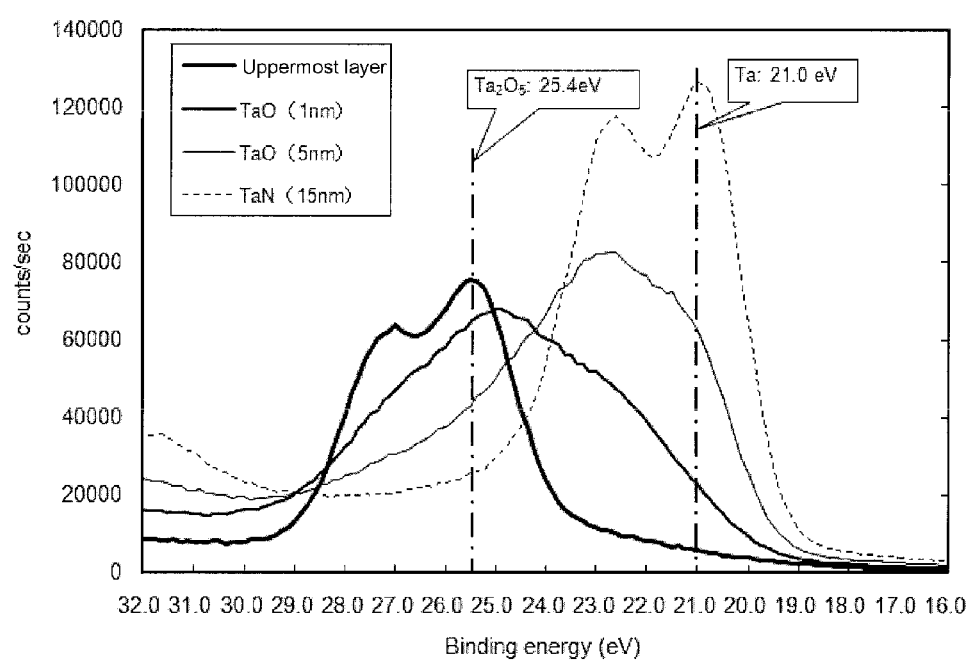
FIG. 7 is a figure showing the results of analyzing a light shielding film of a mask blank in the examples by X-ray photoelectron spectroscopy (XPS) (Ta 4 f narrow spectrum).

In addition, the light shielding film 2 was analyzed by X-ray photoelectron spectroscopy (XPS). The Ta 4 f narrow spectrum of the light shielding film 2 is shown in FIG. 7. A high peak was observed at the location of the binding energy of $Ta_2O_5$ (binding energy: 25.4 eV) in the narrow spectrum of the uppermost layer of the light shielding film 2. In addition, a peak of the Ta 4 f narrow spectrum in a layer at a depth of 1 nm from the surface of the light shielding film 2 was between the binding energy of $Ta_2O_5$ (25.4 eV) and the binding energy of Ta (21.0 eV), and the peak was observed closer to $Ta_2O_5$. From these results, it is possible to say that a highly oxidized layer 242 having $Ta_2O_5$ bonding was formed in the surface layer of the upper layer 24.

Next, the transparent substrate on which the light shielding film had been formed was installed in a single-wafer CD sputtering apparatus, and the etching mask film 3 (hard mask film) composed of CrOCN (Cr: 34 at %, O: 39 at %, C: 11 at %, N: 16 at %) was deposited at a layer thickness of 10 nm by reactive sputtering using a chromium target while introducing a mixed gas of Ar, $CO_2$ and $N_2$. In this manner, the mask blank 101 of Example 1 with the light shielding film 2, having a laminated structure consisting of the lower layer 23 composed of TaN and the upper layer 24 composed of TaO which contains the tantalum highly oxidized layer 242 in the surface layer of the upper layer 2, on the main surface of the transparent substrate, and having the etching mask film 3 composed of CrOCN further laminated thereon, was obtained.

[Production of Transfer Mask]

Next, the transfer mask 201 of Example 1 was fabricated according to the following procedure using the mask blank 101 of Example 1. First, the resist film 4 composed of a chemically amplified resist for electron beam lithography was formed at a layer thickness of 60 nm on the etching mask film 3 by spin coating (see FIG. 4B). Next, a transfer pattern was formed on the resist film 4 by electron beam drawing followed by carrying out prescribed development treatment and washing treatment to form the resist pattern 4a (see FIG. 4C). Furthermore, one of two divided patterns of relatively isolated two transfer patterns for forming a 22 nm node fine pattern using a double patterning technique, was used as the transfer pattern for electron beam drawing. Next, a transfer pattern (etching mask pattern 3a) was formed on the etching mask film 3 by using the resist pattern 4a as a mask and carrying out dry etching using a mixed gas of a chlorine-based gas and oxygen gas (see FIG. 4D). Continuing, after removing the resist pattern 4a, a transfer pattern (upper layer pattern 24a) was formed on the upper layer 24 comprising the highly oxidized layer 242 of the light shielding film 2 by using the etching mask pattern 3a as a mask and carrying out dry etching using a fluorine-based gas ($CF_4$) (see FIG. 4E). At this time, the top side of the lower layer 23 was also etched to a certain degree. Moreover, a transfer pattern (lower layer pattern 23a) was formed on the lower layer 23 of the light shielding layer by using the etching mask pattern 3a or the upper layer pattern 24a as a mask and carrying out dry etching using a chlorine-based gas ($Cl_2$) (see FIG. 4F). Finally, the etching mask pattern 3a was removed by carrying out dry etching using a mixed gas of a chlorine-based gas and oxygen gas (see FIG. 4G). The transfer mask 201 (binary mask) was obtained as a result of carrying out the aforementioned procedure.

The reflectance on the surface side of the light shielding pattern 2a (surface reflectance) of the transfer mask 201 fabricated in Example 1 was 25.2% with respect to ArF exposure light (wavelength: 193 nm), and there was almost no change in comparison with the reflectance of the mask blank measured at the stage of deposition of the light shielding layer 2. In addition, the line edge roughness was measured and it was sufficiently small. Moreover, TEM observation of a cross-section of the sidewalls of the light shielding film pattern 2a was carried out and rounding of the edges of the upper layer pattern 24a was within an allowable range, thereby demonstrating favorable results. A transfer mask, having a transfer pattern consisting of the other one of two divided patterns of relatively isolated two transfer patterns for forming a 22 nm node fine pattern using a double patterning technique, was fabricated using the mask blank of Example 1 according to the same procedure. As a result of carrying out this procedure, the transfer mask set of Example 1 was obtained, which was capable of transferring a 22 nm node fine pattern to a transfer target by carrying out exposure transferring with double patterning technology using two transfer masks.

[Production of Semiconductor Device]

A 22 nm node fine pattern was formed on a resist film on a semiconductor device by exposure transferring using the transfer mask set fabricated in Example 1, using an exposure system adopting an ArF excimer laser for the exposure light and applying double patterning technology. A resist pattern was formed by carrying out prescribed development treatment on the resist film on the semiconductor device after the exposure, and a circuit pattern was formed by using the resist pattern as a mask and dry etching the lower layer. Confirmation of the circuit pattern formed on the semiconductor device revealed that there were no wiring short circuits or disconnections in the circuit pattern attributable to inadequate overlay accuracy.

Example 2

Production of Mask Blank

The mask blank of Example 2 was produced according to the same procedure as Example 1 with the exception of changing the material of the etching mask film 3 to CrO (Cr: 46 at %, O: 54 at %) and changing the layer thickness to 6 nm.

[Production of Transfer Mask]

Next, the transfer mask 201 of Example 2 was fabricated according to the following procedure using the mask blank 101 of Example 2. First, the resist film 4 composed of a chemically amplified resist for electron beam lithography was formed at a layer thickness of 60 nm on the etching mask film 3 by spin coating (see FIG. 4B). Next, a transfer pattern was formed on the resist film 4 by electron beam drawing followed by carrying out prescribed development treatment and washing treatment to form the resist pattern 4a (see FIG. 4C). Furthermore, one of two divided patterns of relatively isolated two transfer patterns for forming a 22 nm node fine pattern using a double patterning technique was used for the transfer pattern for electron beam drawing. Next, a transfer pattern (etching mask pattern 3a) was formed on the etching mask film 3 by using the resist pattern 4a as a mask and carrying out dry etching using a mixed gas of a chlorine-based gas and oxygen gas (see FIG. 4D). Continuing, after removing the resist pattern 4a, a transfer pattern (upper layer pattern 24a) was formed on the upper layer 24 comprising the highly oxidized layer 242 of the light shielding film 2 by using the etching mask pattern 3a as a mask and carrying out dry etching using a fluorine-based gas ($CF_4$) (see FIG. 4E). At this time, the top side of the lower layer 23 was also etched to a certain degree. Moreover, a transfer pattern (lower layer pattern 23a) was formed on the lower layer 23 of the light shielding layer by using the upper layer pattern 24a as a mask and carrying out dry etching using a chlorine-based gas ($Cl_2$). At this time, the etching mask pattern 3a was also completely removed by dry etching using a chlorine-based gas ($Cl_2$) (see FIG. 4G). The transfer mask 201 (binary mask) was obtained as a result of carrying out the aforementioned procedure.

The reflectance on the surface side of the light shielding film 2 (surface reflectance) of the transfer mask 201 fabricated in Example 2 was 25.6% with respect to ArF exposure light (wavelength: 193 nm), and there was almost no change in comparison with the reflectance of the mask blank measured at the stage of deposition of the light shielding film 2. In addition, the line edge roughness was measured and it was sufficiently small. Moreover, TEM observation of a cross-section of the sidewalls of the light shielding film pattern 2a was carried out and rounding of the edges of the upper layer pattern 24a was within an allowable range, thereby demonstrating favorable results. A transfer mask, having a transfer pattern consisting of the other one of two divided patterns of relatively isolated two transfer patterns for forming a 22 nm node fine pattern using a double patterning technique, was fabricated using the mask blank of Example 2 according to the same procedure. As a result of carrying out this procedure, the transfer mask set of Example 2 was obtained, which was capable of transferring a 22 nm node fine pattern to a transfer target by carrying out exposure transferring with double patterning technology using two transfer masks.

[Production of Semiconductor Device]

A 22 nm node fine pattern was formed on a resist film on a semiconductor device by exposure transferring using the transfer mask set fabricated in Example 2, using an exposure system adopting an ArF excimer laser for the exposure light and applying double patterning technology. A resist pattern was formed by carrying out prescribed development treatment on the resist film on the semiconductor device after the exposure, and a circuit pattern was formed by using the resist pattern as a mask and dry etching the lower layer. Confirmation of the circuit pattern formed on the semiconductor device revealed that there were no wiring short circuits or disconnections in the circuit pattern attributable to inadequate overlay accuracy.

Example 3

Production of Mask Blank

The mask blank of Example 3 was produced according to the same procedure as Example 1 with the exception of carrying out the process for forming the highly oxidized layer 242 on the upper layer 24 of the light shielding film 2 by ozone water treatment instead of hot water treatment. Ozone water treatment (surface treatment) was carried out by applying ozone-containing water having an ozone concentration of 50 ppm and temperature of 25° C. under the condition of a treatment time of 15 minutes.

The light shielding film 2 was analyzed by Auger electron spectroscopy (AES) after the ozone water treatment. From the results, it was confirmed that the highly oxidized layer 242 was formed at a thickness of 2 nm on the surface layer of the upper layer 24. The oxygen content of this highly oxidized layer 242 was 71.4 at % to 67 at %. The compositions and optical properties of each of the other layers of the light shielding film 2 were the same as those of the light shielding film 2 of Example 1. In addition, when the light shielding film 2 was analyzed by X-ray photoelectron spectroscopy (XPS), a high peak was observed at the location of the binding energy of $Ta_2O_5$ (binding energy: 25.4 eV) in the Ta 4 f narrow spectrum of the uppermost layer of the light shielding film 2. In addition, a peak of the Ta 4 f narrow spectrum in a layer at a depth of 1 nm from the surface of the light shielding film 2 was between the binding energy of $Ta_2O_5$ (25.4 eV) and the binding energy of Ta (21.0 eV), and the peak was observed closer to $Ta_2O_5$. From these results, it is possible to say that a highly oxidized layer 242 having $Ta_2O_5$ bonding was formed in the surface layer of the upper layer 24.

[Production of Transfer Mask]

Next, the transfer mask of Example 3 was fabricated according to the same procedure as Example 1 using the mask blank of Example 3. The reflectance on the surface side of the light shielding film (surface reflectance) of the transfer mask fabricated in Example 3 was 25.3% with respect to ArF exposure light (wavelength: 193 nm), and there was almost no change in comparison with the reflectance of the mask blank measured at the stage of deposition of the light shielding film 2. In addition, the line edge roughness was measured and it was sufficiently small. Moreover, TEM observation of a cross-section of the sidewalls of the light shielding film pattern 2a was carried out and rounding of the edges of the upper layer pattern 24a was within an allowable range, thereby demonstrating favorable results. A transfer mask, having a transfer pattern consisting of the other one of two divided patterns of relatively isolated two transfer patterns for forming a 22 nm node fine pattern using a double patterning technique, was fabricated using the mask blank of Example 3 according to the same procedure. As a result of carrying out this procedure, the transfer mask set of Example 3 was obtained, which was capable of transferring a 22 nm node fine pattern to a transfer target by carrying out exposure transferring with double patterning technology using two transfer masks.

[Production of Semiconductor Device]

A 22 nm node fine pattern was formed on a resist film on a semiconductor device by exposure transferring using the transfer mask set fabricated in Example 3, using an exposure system adopting an ArF excimer laser for the exposure light and applying double patterning technology. A resist pattern was formed by carrying out prescribed development treatment on the resist film on the semiconductor device after the exposure, and a circuit pattern was formed by using the resist pattern as a mask and dry etching the lower layer. Confirmation of the circuit pattern formed on the semiconductor device revealed that there were no wiring short circuits or disconnections in the circuit pattern attributable to inadequate overlay accuracy.

Example 4

Production of Mask Blank

The mask blank of Example 4 was produced according to the same procedure as Example 1 with the exception of carrying out the process for forming the highly oxidized layer 242 on the upper layer 24 of the light shielding film 2 by heat treatment instead of hot water treatment. Heat treatment (surface treatment) was carried out in air under conditions of a heating temperature of 140° C. and treatment time of 30 minutes.

The light shielding film 2 was analyzed by Auger electron spectroscopy (AES) after the heat treatment. From the results, it was confirmed that the highly oxidized layer 242 was formed at a thickness of 2 nm on the surface layer of the upper layer 24. The oxygen content of this highly oxidized layer 242 was 71.4 at % to 67 at %. The compositions and optical properties of each of the other layers of the light shielding film 2 were the same as those of the light shielding film 2 of Example 1. In addition, when the light shielding film 2 was analyzed by X-ray photoelectron spectroscopy (XPS), a high peak was observed at the location of the binding energy of $Ta_2O_5$ (binding energy: 25.4 eV) in the Ta 4 f narrow spectrum of the uppermost layer of the light shielding film 2. In addition, a peak of the Ta 4 f narrow spectrum in a layer at a depth of 1 nm from the surface of the light shielding film 2 was between the binding energy of $Ta_2O_5$ (25.4 eV) and the binding energy of Ta (21.0 eV), and the peak was observed closer to $Ta_2O_5$. From these results, it is possible to say that a highly oxidized layer 242 having $Ta_2O_5$ bonding was formed in the surface layer of the upper layer 24.

[Production of Transfer Mask]

Next, the transfer mask of Example 4 was fabricated according to the same procedure as Example 1 using the mask blank of Example 4. The reflectance on the surface side of the light shielding film (surface reflectance) of the transfer mask fabricated in Example 4 was 25.3% with respect to ArF exposure light (wavelength: 193 nm), and there was almost no change in comparison with the reflectance of the mask blank measured at the stage of deposition of the light shielding film 2. In addition, the line edge roughness was measured and it was sufficiently small. Moreover, TEM observation of a cross-section of the sidewalls of the light shielding film pattern 2a was carried out and rounding of the edges of the upper layer pattern 24a was within an allowable range, thereby demonstrating favorable results. A transfer mask, having a transfer pattern consisting of the other one of two divided patterns of relatively isolated two transfer patterns for forming a 22 nm node fine pattern using a double patterning technique, was fabricated using the mask blank of Example 4 according to the same procedure. As a result of carrying out this procedure, the transfer mask set of Example 4 was obtained, which was capable of transferring a 22 nm node fine pattern to a transfer target by carrying out exposure transferring with double patterning technology using two transfer masks.

[Production of Semiconductor Device]

A 22 nm node fine pattern was formed on a resist film on a semiconductor device by exposure transferring using the transfer mask set fabricated in Example 4, using an exposure system adopting an ArF excimer laser for the exposure light and applying double patterning technology. A resist pattern was formed by carrying out prescribed development treatment on the resist film on the semiconductor device after the exposure, and a circuit pattern was formed by using the resist pattern as a mask and dry etching the lower layer. Confirmation of the circuit pattern formed on the semiconductor device revealed that there were no wiring short circuits or disconnections in the circuit pattern attributable to inadequate overlay accuracy.

Example 5

Production of Mask Blank

The mask blank of Example 5 was produced according to the same procedure as Example 1 with the exception of carrying out the process for forming the highly oxidized layer 242 on the upper layer 24 of the light shielding film 2 by ultraviolet irradiation treatment instead of hot water treatment. Ultraviolet irradiation treatment (surface treatment) was carried out by scanning the entire surface with ArF excimer laser light of 50 mJ/cm$^2$ at a scanning rate of 1 cm/second.

The light shielding film 2 was analyzed by Auger electron spectroscopy (AES) after the ultraviolet irradiation treatment. From the results, it was confirmed that the highly oxidized layer 242 was formed at a thickness of 2 nm on the surface layer of the upper layer 24. The oxygen content of this highly oxidized layer 242 was 71.4 at % to 67 at %. The compositions and optical properties of each of the other layers of the light shielding film 2 were the same as those of the light shielding film 2 of Example 1. In addition, when the light shielding film 2 was analyzed by X-ray photoelectron spectroscopy (XPS), a high peak was observed at the location of the binding energy of $Ta_2O_5$ (binding energy: 25.4 eV) in the Ta 4 f narrow spectrum of the uppermost layer of the light shielding film 2. In addition, a peak of the Ta 4 f narrow spectrum in a layer at a depth of 1 nm from the surface of the light shielding film 2 was between the binding energy of $Ta_2O_5$ (25.4 eV) and the binding energy of Ta (21.0 eV), and the peak was observed closer to $Ta_2O_5$. From these results, it is possible to say that a highly oxidized layer 242 having $Ta_2O_5$ bonding was formed in the surface layer of the upper layer 24.

[Production of Transfer Mask]

Next, the transfer mask of Example 5 was fabricated according to the same procedure as Example 1 using the mask blank of Example 5. The reflectance on the surface side of the light shielding film (surface reflectance) of the transfer mask fabricated in Example 5 was 25.2% with respect to ArF exposure light (wavelength: 193 nm), and there was almost no change in comparison with the reflectance of the mask blank measured at the stage of deposition of the light shielding film 2. In addition, the line edge roughness was measured and it was sufficiently small. Moreover, TEM observation of a cross-section of the sidewalls of the light shielding film pattern 2a was carried out and rounding of the edges of the upper layer pattern 24a was within an allowable range, thereby demonstrating favorable results. A transfer mask, having a transfer pattern consisting of the other one of two divided patterns of relatively isolated two transfer patterns for forming a 22 nm node fine pattern using a double patterning technique, was fabricated using the mask blank of Example 5 according to the same procedure. As a result of carrying out this procedure, the transfer mask set of Example 5 was obtained, which was capable of transferring a 22 nm node fine pattern to a transfer target by carrying out exposure transferring with double patterning technology using two transfer masks.

[Production of Semiconductor Device]

A 22 nm node fine pattern was formed on a resist film on a semiconductor device by exposure transferring using the transfer mask set fabricated in Example 5, using an exposure system adopting an ArF excimer laser for the exposure light and applying double patterning technology. A resist pattern was formed by carrying out prescribed development treatment on the resist film on the semiconductor device following exposure, and a circuit pattern was formed by using the resist pattern as a mask and dry etching the lower layer. Confirmation of the circuit pattern formed on the semiconductor device revealed that there were no wiring short circuits or disconnections in the circuit pattern attributable to inadequate overlay accuracy.

Example 6

Production of Mask Blank

The mask blank of Example 6 was produced according to the same procedure as Example 1 with the exception of carrying out the process for forming the highly oxidized layer 242 on the upper layer 24 of the light shielding film 2 by oxygen plasma treatment instead of hot water treatment. Oxygen plasma treatment (surface treatment) was carried out by introducing the mask blank 101 into a resist stripping apparatus for carrying out oxygen plasma ashing under conditions of a treatment time of 5 minutes.

The light shielding film 2 was analyzed by Auger electron spectroscopy (AES) after the oxygen plasma treatment. From the results, it was confirmed that the highly oxidized layer 242 was formed at a thickness of 2 nm on the surface layer of the upper layer 24. The oxygen content of this highly oxidized layer 242 was 71.4 at % to 67 at %. The compositions and optical properties of each of the other layers of the light shielding film 2 were the same as those of the light shielding film 2 of Example 1. In addition, when the light shielding film 2 was analyzed by X-ray photoelectron spectroscopy (XPS), a high peak was observed at the location of the binding energy of $Ta_2O_5$ (binding energy: 25.4 eV) in the Ta 4 f narrow spectrum of the uppermost layer of the light shielding film 2. In addition, a peak of the Ta 4 f narrow spectrum in a layer at a depth of 1 nm from the surface of the light shielding film 2 was between the binding energy of $Ta_2O_5$ (25.4 eV) and the binding energy of Ta (21.0 eV), and the peak was observed closer to $Ta_2O_5$. From these results, it is possible to say that a highly oxidized layer 242 having $Ta_2O_5$ bonding was formed in the surface layer of the upper layer 24.

[Production of Transfer Mask]

Next, the transfer mask of Example 6 was fabricated according to the same procedure as Example 1 using the mask blank of Example 6. The reflectance on the surface side of the light shielding film (surface reflectance) of the transfer mask fabricated in Example 6 was 25.3% with respect to ArF exposure light (wavelength: 193 nm), and there was almost no change in comparison with the reflectance of the mask blank measured at the stage of deposition of the light shielding film 2. In addition, the line edge roughness was measured and it was sufficiently small. Moreover, TEM observation of a cross-section of the sidewalls of the light shielding film pattern 2a was carried out and rounding of the edges of the upper layer pattern 24a was within an allowable range, thereby demonstrating favorable results. A transfer mask, having a transfer pattern consisting of the other one of two divided patterns of relatively isolated two transfer patterns for forming a 22 nm node fine pattern using a double patterning technique, was fabricated using the mask blank of Example 6 according to the same procedure. As a result of carrying out this procedure, the transfer mask set of Example 6 was obtained, which was capable of transferring a 22 nm node fine pattern to a transfer target by carrying out exposure transferring with double patterning technology using two transfer masks.

[Production of Semiconductor Device]

A 22 nm node fine pattern was formed on a resist film on a semiconductor device by exposure transferring using the transfer mask set fabricated in Example 6, using an exposure system adopting an ArF excimer laser for the exposure light and applying double patterning technology. A resist pattern was formed by carrying out prescribed development treatment on the resist film on the semiconductor device after the exposure, and a circuit pattern was formed by using the resist pattern as a mask and dry etching the lower layer. Confirmation of the circuit pattern formed on the semiconductor device revealed that there were no wiring short circuits or disconnections in the circuit pattern attributable to inadequate overlay accuracy.

Example 7

The transparent substrate 1 was prepared that was composed of synthetic quartz glass having vertical and horizontal dimensions of about 152 mm×152 mm and having a thickness of about 6.25 mm. The edge faces and main surface of this transparent substrate 1 were polished to a prescribed surface roughness (root mean square roughness Rq: not more than 0.2 nm), and after carrying out prescribed washing treatment and drying treatment, heat treatment (500° C., 40 minutes) was carried out to eliminate hydrogen from the surface layer of the transparent substrate.

Next, the transparent substrate 1 was installed in a single-wafer DC sputtering apparatus and the light reflecting layer 2 composed of TaN was deposited at a layer thickness of 49 nm by reactive sputtering using a tantalum target while introducing a mixed gas of Xe and $N_2$. As a result of the aforementioned procedure, the light shielding film 2 composed of TaN was formed on the transparent substrate 1.

Next, hot water treatment (surface treatment) was carried out on the transparent substrate 1 on which the light shielding film 2 composed of a tantalum-based material was formed by immersing for 120 minutes in deionized (DI) water at 90° C. prior to the progression of natural oxidation (such as within 1 hour after deposition) or after storing in an environment in which natural oxidation does not progress after the deposition. Auger electron spectroscopy (AES) was then carried out on the light shielding film after the hot water treatment. From the results, it was confirmed that the highly oxidized layer 22 was formed at a thickness of 2 nm on the surface layer of the light shielding film 2. The oxygen content of the highly oxidized layer 22 was 71.4 at % to 67 at %. In addition, the composition of the light shielding film excluding the highly oxidized layer consisted of Ta: 77 at % and N: 23 at %. Furthermore, the optical density (OD) of this light shielding film 2 with respect to ArF exposure light was 3.1.

In addition, the light shielding film 2 was analyzed by X-ray photoelectron spectroscopy (XPS). A high peak was observed at the location of the binding energy of $Ta_2O_5$ (binding energy: 25.4 eV) in the Ta 4 f narrow spectrum of the uppermost layer of the light shielding film 2. In addition, a peak of the Ta 4 f narrow spectrum in a layer at a depth of 1 nm from the surface of the light shielding film 2 was between the binding energy of $Ta_2O_5$ (25.4 eV) and the binding energy of Ta (21.0 eV), and the peak was observed closer to $Ta_2O_5$. From these results, it is possible to say that a highly oxidized layer 22 having $Ta_2O_5$ bonding was formed in the surface layer of the light shielding film 2.

Next, the transparent substrate on which the light shielding film 2 had been formed was installed in a single-wafer CD sputtering apparatus, and the etching mask film 3 (hard mask film) composed of CrO (Cr: 46 at %, O: 54 at %) was deposited at a layer thickness of 6 nm by reactive sputtering using a chromium target while introducing a mixed gas of Ar and $O_2$. In this manner, the mask blank 100 of Example 7 with the light shielding film 2 composed of TaN comprising the tantalum highly oxidized layer 22 on the main surface of the light shielding film 2, and having the etching mask film 3 composed of CrO further laminated thereon, was obtained.

[Production of Transfer Mask]

Next, the transfer mask 200 of Example 7 was fabricated according to the following procedure using the mask blank 100 of Example 7. First, the resist film 4 composed of a chemically amplified resist for electron beam lithography was formed at a layer thickness of 60 nm on the etching mask film 3 by spin coating (see FIG. 4B). Next, a transfer pattern was formed on the resist film 4 by electron beam drawing followed by carrying out prescribed development treatment and washing treatment to form the resist pattern 4a (see FIG. 4C). Furthermore, one of two divided patterns of relatively isolated two transfer patterns for forming a 22 nm node fine pattern using a double patterning technique was used for the transfer pattern for electron beam drawing. Next, a transfer pattern (etching mask pattern 3a) was formed on the etching mask film 3 by using the resist pattern 4a as a mask and carrying out dry etching using a mixed gas of a chlorine-based gas and oxygen gas (see FIG. 4D). Continuing, after removing the resist pattern 4a, a transfer pattern (light shielding film pattern 2a) was formed on the light shielding film 2 comprising the highly oxidized layer 22 by using the etching mask pattern 3a as a mask and carrying out dry etching using a chlorine-based gas ($Cl_2$) (see FIG. 4E). Finally, the etching mask pattern 3a was removed by carrying out dry etching using a mixed gas of a chlorine-based gas and oxygen gas (see FIG. 4F). The transfer mask 200 (binary mask) was obtained as a result of carrying out the aforementioned procedure.

There was almost no change of the reflectance on the surface side of the light shielding film 2 (surface reflectance) of the transfer mask 200 fabricated in Example 7 in comparison with the reflectance of the mask blank measured at the stage of deposition of the light shielding film 2. In addition, the line edge roughness was measured and it was sufficiently small. Moreover, TEM observation of a cross-section of the sidewalls of the light shielding film pattern 2a was carried out and rounding of the edges of the light shielding film pattern 2a was within an allowable range, thereby demonstrating favorable results. A transfer mask, having a transfer pattern consisting of the other one of two divided patterns of relatively isolated two transfer patterns for forming a 22 nm node fine pattern using a double patterning technique, was fabricated using the mask blank of Example 7 according to the same procedure. As a result of carrying out this procedure, the transfer mask set of Example 7 was obtained, which was capable of transferring a 22 nm node fine pattern to a transfer target by carrying out exposure transferring with double patterning technology using two transfer masks.

[Production of Semiconductor Device]

A 22 nm node fine pattern was formed on a resist film on a semiconductor device by exposure transferring using the transfer mask set fabricated in Example 7, using an exposure system adopting an ArF excimer laser for the exposure light and applying double patterning technology. A resist pattern was formed by carrying out prescribed development treatment on the resist film on the semiconductor device after the exposure, and a circuit pattern was formed by using the resist pattern as a mask and dry etching the lower layer. Confirmation of the circuit pattern formed on the semiconductor device revealed that there were no wiring short circuits or disconnections in the circuit pattern attributable to inadequate overlay accuracy.

Comparative Example 1

Production of Mask Blank

The mask blank of Comparative Example 1 was produced according to the same procedure as Example 1 with the exception of immediately forming the etching mask film 3 after forming the upper layer 24 on the light shielding film 2 (and the process for forming the highly oxidized layer 242 was not carried out).

[Production of Transfer Mask]

Next, the transfer mask of Comparative Example 1 was fabricated according to the same procedure as Example 1 using the mask blank of Comparative Example 1. The reflectance on the surface side of the light shielding film 2 (surface reflectance) of the transfer mask fabricated in Comparative Example 1 was 28.5% with respect to ArF exposure light (wavelength: 193 nm), and the change in reflectance was large in comparison with the reflectance of the mask blank measured at the stage of deposition of the light shielding film 2 in Example 1 under the same conditions. The distribution of in-plane reflectance of the light shielding film 2 was also confirmed to have worsened. In addition, measurement of line edge roughness exceeded the allowable range in the 22 nm node. TEM observation of a cross-section of the sidewalls of the light shielding film pattern 2a was carried out and rounding of the edges of the upper layer pattern 24a exceeded the allowable range. A transfer mask, having a transfer pattern consisting of the other one of two divided patterns of relatively isolated two transfer patterns for forming a 22 nm node fine pattern using a double patterning technique, was fabricated using the mask blank of Comparative Example 1 according to the same procedure. As a result of carrying out this procedure, the transfer mask set of Comparative Example 1 was obtained, which transferred a 22 nm node fine pattern to a transfer target by carrying out exposure transferring with double patterning technology using two transfer masks.

[Production of Semiconductor Device]

A 22 nm node fine pattern was formed on a resist film on a semiconductor device by exposure transferring using the transfer mask set fabricated in Comparative Example 1, using an exposure system adopting an ArF excimer laser for the exposure light and applying double patterning technology. A resist pattern was formed by carrying out prescribed development treatment on the resist film on the semiconductor device after the exposure, and a circuit pattern was formed by using the resist pattern as a mask and dry etching the lower layer. Confirmation of the circuit pattern formed on the semiconductor device revealed that there were occasional occurrences of short circuits and disconnections in the circuit pattern attributable to inadequate overlay accuracy. Thus, that the transfer mask set of Comparative Example 1 was not capable of transferring a 22 nm node fine pattern to a transfer target.

The invention claimed is:

1. A mask blank used to fabricate a transfer mask, which has a laminated structure of a light shielding film and an etching mask film in this order on a transparent substrate, wherein
   the etching mask film comprises a material containing chromium,
   the light shielding film comprises a material containing tantalum,
   a highly oxidized layer is formed on the surface layer of the light shielding film on the opposite side from the transparent substrate, and
   a Ta 4f narrow spectrum of the highly oxidized layer analyzed by X-ray photoelectron spectroscopy has a maximum peak at a binding energy of more than 23 eV.

2. The mask blank according to claim 1, wherein the Ta 4f narrow spectrum of the portion of the light shielding film other than the highly oxidized layer has a maximum peak at a binding energy of not more than 23 eV, when the light shielding film is analyzed by X-ray photoelectron spectroscopy.

3. The mask blank according to claim 1, wherein the light shielding film comprises a material that does not contain silicon.

4. The mask blank according to claim 1, wherein the light shielding film comprises a material that further contains nitrogen.

5. The mask blank according to claim 1, wherein the light shielding film has a laminated structure of a lower layer and an upper layer in this order starting from the side of the transp/arent substrate, and
   the highly oxidized layer is formed on the surface layer of the upper layer on the opposite side from the lower layer.

6. The mask blank according to claim 5, wherein the oxygen content of the upper layer is less than the oxygen content of the highly oxidized layer.

7. The mask blank according to claim 6, wherein the oxygen content of the upper layer is not less than 67 at %, and the oxygen content in the portion of the upper layer other than the highly oxidized layer is not less than 50 at %.

8. A method of manufacturing a transfer mask that uses the mask blank according to claim 5, comprising the steps of:
   forming a resist film having a transfer pattern on the etching mask film,
   forming a transfer pattern in the etching mask film by using the resist film having the transfer pattern as a mask and dry etching using a mixed gas of a chlorine-based gas and oxygen gas;
   forming a transfer pattern in the upper layer by using the resist film or etching mask film in which the transfer pattern has been formed as a mask, and dry etching using a fluorine-based gas;
   forming a transfer pattern in the lower layer by using the resist film, etching mask film or upper layer in which the transfer pattern has been formed as a mask, and dry etching using chlorine-based gas substantially without containing oxygen; and
   removing the etching mask film by dry etching using a mixed gas of a chlorine-based gas and oxygen gas after forming the transfer pattern in the lower layer.

9. The mask blank according to claim 5, wherein the ratio of the presence of $Ta_2O_5$ bonding in the highly oxidized layer is higher than the ratio of the presence of $Ta_2O_5$ bonding in the upper layer.

10. The mask blank according to claim 5, wherein the oxygen content of the lower layer is less than 10 at %.

11. The mask blank according to claim 5, wherein the lower layer comprises a material that contains nitrogen.

12. The mask blank according to claim 5, wherein the oxygen content of the etching mask film is not less than 40 at %.

13. The mask blank according to claim 12, wherein the thickness of the etching mask film is not more than 7 nm.

14. A method of manufacturing a transfer mask that uses the mask blank according to claim 13, comprising the steps of:
   forming a resist film having a transfer pattern on the etching mask film;
   forming a transfer pattern in the etching mask film by using the resist film having the transfer pattern as a mask and dry etching using a mixed gas of a chlorine-based gas and oxygen gas;
   removing the resist film;
   forming a transfer pattern in the upper layer by using the etching mask film having the transfer pattern as a mask, and dry etching using a fluorine-based gas; and
   forming a transfer pattern in the lower layer by using the upper layer in which the transfer pattern has been formed as a mask and dry etching using chlorine-based gas substantially without containing oxygen, and removing the etching mask film.

15. A transfer mask fabricated using the mask blank according to claim 1.

16. A method of manufacturing a semiconductor device, comprising exposing and transferring a transfer pattern to a resist film on a semiconductor substrate using the transfer mask according to claim 15.

17. A method of manufacturing a transfer mask that uses the mask blank according to claim 1, comprising the steps of:
   forming a resist film having a transfer pattern on the etching mask film;
   forming a transfer pattern in the etching mask film by using the resist film in which the transfer pattern has been formed as a mask and dry etching using a mixed gas of a chlorine-based gas and oxygen gas;
   forming a transfer pattern in the light shielding film by dry etching using the resist film or etching mask film in which the transfer pattern has been formed as a mask; and
   removing the etching mask film by dry etching using a mixed gas of a chlorine-based gas and oxygen gas after forming the transfer pattern in the light shielding film.

18. A method of manufacturing a semiconductor device, comprising exposing and transferring a transfer pattern to a resist film on a semiconductor substrate using a transfer mask fabricated according to the method of manufacturing the transfer mask according to claim 17.

* * * * *